United States Patent
Fantini et al.

(10) Patent No.: US 11,587,606 B2
(45) Date of Patent: Feb. 21, 2023

(54) DECODING ARCHITECTURE FOR MEMORY DEVICES

(71) Applicant: Micron Technology, Inc., Boise, ID (US)

(72) Inventors: Paolo Fantini, Vimercate (IT); Enrico Varesi, Milan (IT); Lorenzo Fratin, Buccinasco (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/231,657

(22) Filed: Apr. 15, 2021

(65) Prior Publication Data

US 2022/0336005 A1  Oct. 20, 2022

(51) Int. Cl.
  *G11C 11/408*  (2006.01)
  *G11C 5/06*  (2006.01)
  *G11C 11/4074*  (2006.01)

(52) U.S. Cl.
  CPC ......... *G11C 11/4085* (2013.01); *G11C 5/06* (2013.01); *G11C 11/4074* (2013.01); *G11C 11/4087* (2013.01)

(58) Field of Classification Search
  CPC ... G11C 11/4085; G11C 5/06; G11C 11/4074; G11C 11/4087
  USPC .................................................... 365/230.06
  See application file for complete search history.

(56) References Cited

U.S. PATENT DOCUMENTS

| | | |
|---|---|---|
| 8,289,763 B2 | 10/2012 | Liu |
| 8,488,374 B2 | 7/2013 | Liu |
| 8,891,280 B2 | 11/2014 | Castro et al. |
| 9,406,362 B2 | 8/2016 | Castro et al. |
| 9,406,781 B2 | 8/2016 | Rabkin et al. |
| 9,412,421 B2 | 8/2016 | Liu |
| 9,792,958 B1 | 10/2017 | Laurent |
| 10,074,693 B2 | 9/2018 | Castro |
| 10,347,333 B2 | 7/2019 | Laurent |
| 10,818,324 B2 | 10/2020 | Castro et al. |

(Continued)

OTHER PUBLICATIONS

PCT Application No. PCT/IB2019/001256 by Fantini et al., entitled "Vertical 3D Memory Device and Method for Manufacturing the Same", as filed on Dec. 18, 2019 (60 pages).

(Continued)

*Primary Examiner* — Huan Hoang
(74) *Attorney, Agent, or Firm* — Holland & Hart LLP

(57) ABSTRACT

Methods, systems, and devices for a decoding architecture for memory devices are described. Word line plates of a memory array may each include a sheet of conductive material that includes a first portion extending in a first direction within a plane along with multiple fingers extending in a second direction within the plane. Two word line plates in a same plane may be activated via a shared electrode. Memory cells coupled with the two word line plates sharing the electrode, or a subset thereof, may represent a logical page for accessing memory cells. A memory cell may be accessed via a first voltage applied to a word line plate coupled with the memory cell and a second voltage applied to a pillar electrode coupled with the memory cell. Parallel or simultaneous access operations may be performed for two or more memory cells within a same page of memory cells.

35 Claims, 11 Drawing Sheets

(56) References Cited

U.S. PATENT DOCUMENTS

| | | | |
|---|---|---|---|
| 2002/0172070 A1* | 11/2002 | Arimoto | H01L 27/0207 257/E21.654 |
| 2009/0128888 A1* | 5/2009 | Ichikawa | G09G 3/346 345/84 |
| 2013/0107628 A1 | 5/2013 | Dong et al. | |
| 2015/0332762 A1 | 11/2015 | Lee et al. | |
| 2015/0380089 A1 | 12/2015 | Aritome | |
| 2020/0203429 A1 | 6/2020 | Fantini et al. | |
| 2020/0303403 A1 | 9/2020 | Nakatsuka et al. | |
| 2020/0350203 A1 | 11/2020 | Fratin et al. | |

OTHER PUBLICATIONS

PCT Application No. PCT/IB2020/020078, by Micron Technology, Inc., entitled "Memory Apparatus and Methods for Accessing and Manufacturing the Same", filed Dec. 9, 2020 (55 pages).

PCT Application No. PCT/IB2020/020036, by Micron Technology, Inc., entitled "3D Quilt Memory Array for FERAM and DRAM", filed Jul. 14, 2020 (47 pages).

"International Search Report and Written Opinion of the International Searching Authority," issued in connection with Int'l Appl. No. PCT/US2022/071592 dated Jul. 25, 2022 (9 pages).

Taiwanese Patent Office, "Office Action and Search Report", issued in connection with Taiwanese Patent Application No. 111113934 dated Jan. 1, 2023 (6 pages).

* cited by examiner

DECODING ARCHITECTURE FOR MEMORY DEVICES

FIELD OF TECHNOLOGY

The following relates generally to one or more systems for memory and more specifically to decoding architecture for memory devices.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
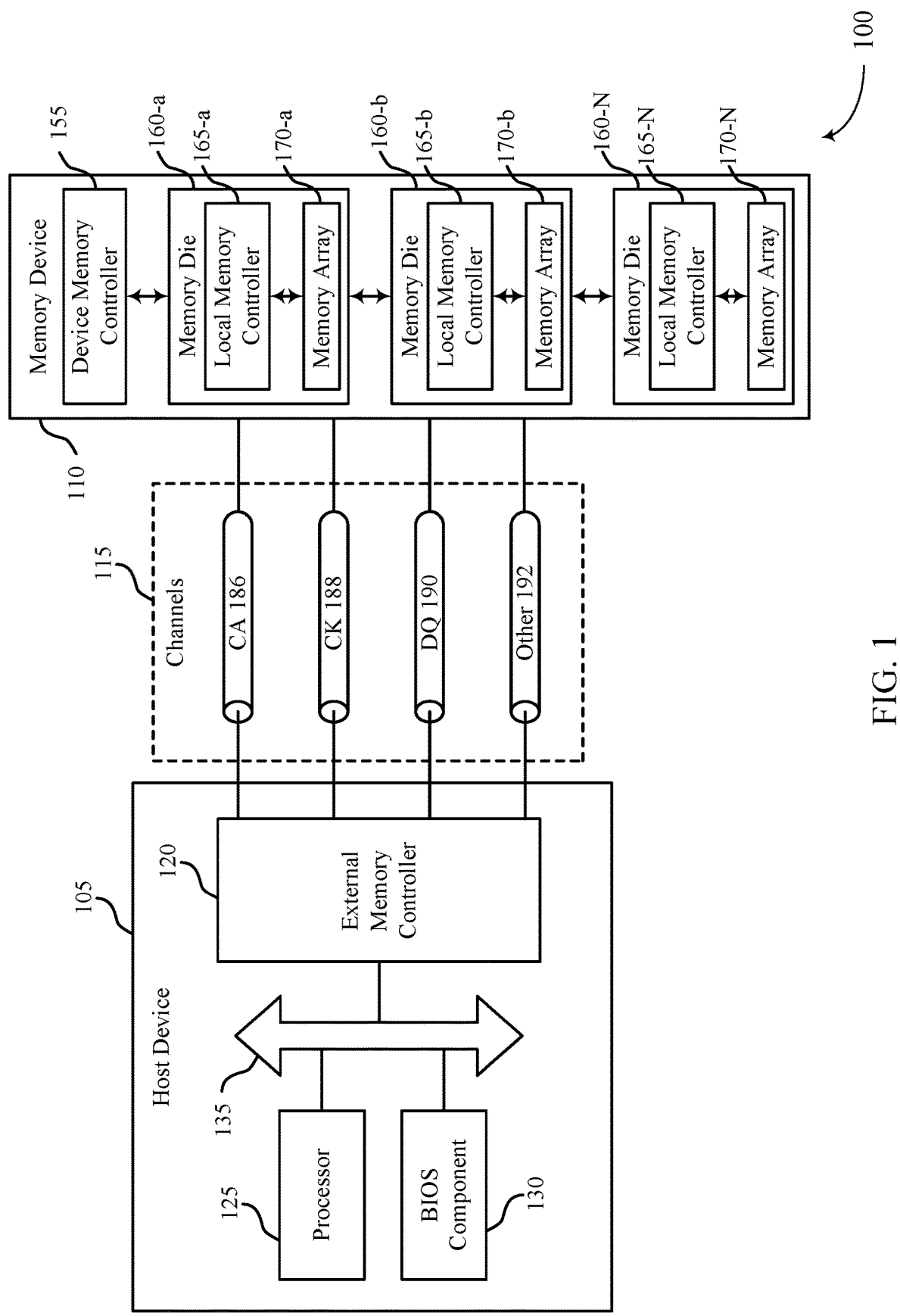
FIG. 1 illustrates an example of a system that supports a decoding architecture for memory devices in accordance with examples as disclosed herein.

Word line plates of a memory array may each include multiple word lines in a "comb" structure (e.g., a structure that may look like a tool with fingers and a space between each pair of adjoining fingers). A word line plate may, for example, include a sheet of conductive material that includes a first portion extending in a first direction within a plane, and multiple fingers extending in a second direction within the plane. Each finger of a word line plate may represent a word line as described herein. A word line plate may be coupled with an electrode, via which a word line decoder may be operable to apply a voltage to the word line plate for accessing associated memory cells. In order to reduce a footprint of supporting circuitry for a memory device, two word line plates in a same plane may share an electrode for activating the word line plates. The two word line plates sharing the electrode may be (or alternatively include) a page for accessing memory cells (e.g., a logical page for accessing memory cells). For example, a first page (e.g., an even page) may include two first word line plates extending out (e.g., to the left and right) from a first electrode, and a second page (e.g., an odd page) may include two second word line plates extending out (e.g., to the left and right) from a second electrode. In some cases, word line plates may be vertically stacked above or below one or more other word line plates, and a group of electrodes coupled with different word line plates at different levels or planes of the stack may be referred to as a staircase.

A memory cell may be accessed via a first voltage applied to a word line plate coupled with the memory cell and a second voltage applied to a pillar (e.g., a vertical electrode structure electrically isolated from the word line plate) coupled with the memory cell. A pillar tile may be associated with multiple word line tiles (e.g., representing one or two word line plates), where a pillar tile may represent a portion of pillars within a memory array that may be accessed using one set of complementary decoders, such as a set of one X-direction pillar decoder to decode lines that extend in the Y direction and one Y-direction pillar decoder to decode pillar lines that extend in the X direction, where the X and Y directions may respectively correspond to row lines and column lines (or vice versa), which may be referred to as pillar row lines and pillar column lines, and which may be coupled with and operable to selectively activate the pillar selectors. A pillar tile may define (e.g., independently from a word line tile) a total area (e.g., maximum area) of pillars and associated memory cells that may be decoded using the first pillar decoder (e.g., in an X direction) and the second pillar decoder (e.g., in a Y direction). Associating a pillar tile with multiple word line tiles (e.g., such that the pillar tile is larger than the word line tiles and includes memory cells within multiple word line tiles) may reduce a footprint of pillar decoders, for example, by supporting one pillar decoder for all of the pillars of the pillar tile (e.g., as opposed to one pillar decoder for each word line tile).

A memory array as described herein may support parallel or concurrent (e.g., simultaneous) access operations for two or more memory cells within a same page of memory cells. For example, a first pillar coupled with a first memory cell associated with (e.g., coupled with) a left-hand word line plate (e.g., first word line plate) of a page may be activated and the first word line plate of the page may be activated. In parallel, a second pillar coupled with a second memory cell associated with (e.g., coupled with) a right-hand word line plate (e.g., second word line plate) of the page may be activated and the second word line plate of the page may be activated. Additionally are alternatively, multiple memory cells coupled with different word lines of the same word line plate may be concurrently accessed using the array architecture and other aspects of the teachings herein. Thus, memory cells respectively associated with the left-hand word line plate, the right-hand word line plate, or both may be accessed in parallel, which may increase access operation speed, data throughput, or both. Additionally or alternatively, decoding structures and configurations as described herein may support a reduced area requirement for decoding circuitry associated with accessing the memory cells as described herein, which may improve an ability to fit decoders physically within an area occupied by the array of memory cells (e.g., within one or more circuitry layers located between the array and a substrate or otherwise below the array, within a footprint of the array). Such benefits are merely exemplary, and one of ordinary skill in the art may appreciate further benefits.

Features of the disclosure are initially described in the context of memory systems, dies, and arrays as described with reference to FIGS. 1-3. Features of the disclosure are described in the context of memory arrays and array architectures as described with reference to FIGS. 4-8. These and other features of the disclosure are further illustrated by and described with reference to an apparatus diagram and flowcharts that relate to decoding architecture for memory devices as described with references to FIGS. 10-11.

FIG. 1 illustrates an example of a system 100 that supports a decoding architecture for memory devices in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory array as described herein may support parallel or simultaneous access operations for two or more memory cells within a same page of memory cells. For example, a first pillar coupled with a first memory cell associated with (e.g., coupled with) a left-hand word line plate (e.g., first word line plate) of a page may be activated and the first word line plate of the page may be activated. In parallel, a second pillar coupled with a second memory cell associated with (e.g., coupled with) a right-hand word line plate (e.g., second word line plate) of the page may be activated and the second word line plate of the page may be activated. Thus, memory cells respectively associated with the left-hand word line plate and the right-hand word line plate may be accessed in parallel, which may increase access operation speed, data throughput, or both. Additionally or alternatively, decoding structures and configurations as described herein may support a reduced area requirement for decoding circuitry associated with accessing the memory cells as described herein, which may improve an ability to fit decoders physically within an area occupied by the array of memory cells (e.g., within one or more circuitry layers located between the array and a substrate or otherwise below the array, within a footprint of the array).

Figure 2:
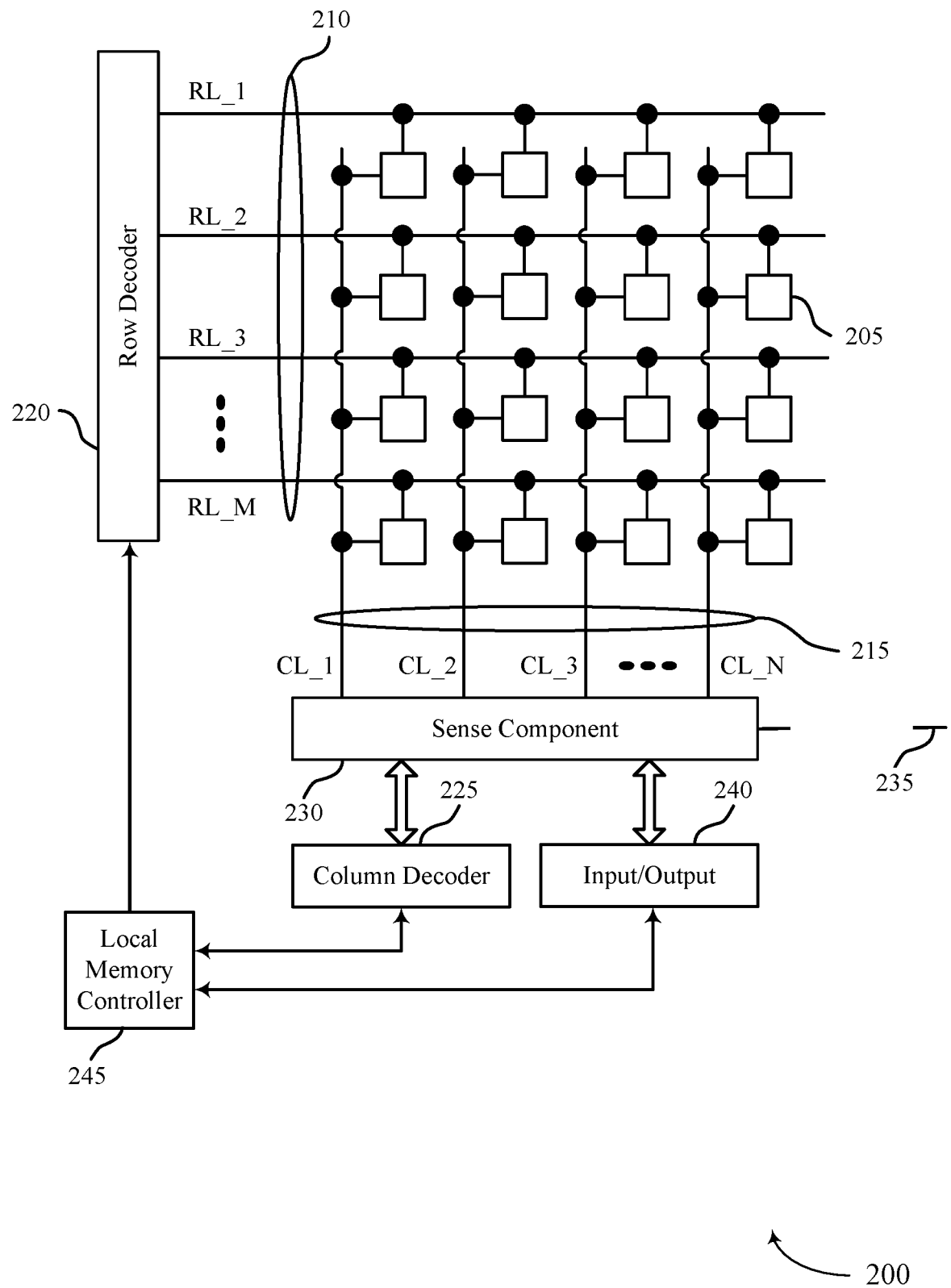
FIG. 2 illustrates an example of a memory die that supports a decoding architecture for memory devices in accordance with examples as disclosed herein.

FIG. 2 illustrates an example of a memory die 200 that supports a decoding architecture for memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

FIG. 2 may illustrate various features related to the electrical operation of a memory array, but the physical location and configuration of components may deviate from the depiction in FIG. 2. For example, the features illustrated by FIG. 2 may be representative of memory cells 205 being located at an intersection of respective access lines (e.g., row lines 210 and column lines 215), may be representative of electrical function of memory cells and other array components, or both, but a memory array may in some cases have a different physical architecture or structure relative to that illustrated by FIG. 2 (e.g., as described below with reference to FIGS. 3-8).

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include access lines (e.g., row lines 210 and the column lines 215). Access lines may be formed of one or more conductive materials. In some examples, row lines 210 may be referred to as word lines. In some examples, column lines 215 may be referred to as digit lines or bit lines. In some cases, additional types of access lines may be present as described elsewhere herein. References to access lines, row lines, column lines, word lines, digit lines, or bit lines, or their analogues, are interchangeable without loss of understanding or operation. Memory cells 205 may be positioned, for example, at intersections of the row lines 210 (e.g., fingers of a word line plate) and the column lines 215 (e.g., pillars or other vertical electrode structures).

In some cases, one or more column lines 215 (e.g., a column line CL_i) may run perpendicularly to a substrate and one or more row lines 210 (e.g., a row line RL_i_ may be on a different deck than illustrated (e.g., each row line 210 may be a word line finger of a word line plate stacked in a vertical direction). In such cases, a memory cell 205 may be formed at an intersection of the column line CL_i and the row line RL_i (e.g., between a pillar and a word line finger of a stacked word line plate). One or more other memory cells 205 may be coupled between one or more other row lines 210 (not pictured in FIG. 2) of one or more other stacked word line plates (not pictured in FIG. 2) and the column line CL_i as well as between one or more other row lines 210 (not pictured in FIG. 2) and one or more other column lines 215 (e.g., pillars, not depicted).

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

Word line plates as described herein may each include multiple word lines (e.g., column lines 215 or row lines 210) in a "comb" structure (e.g., a structure that may look like a tool with fingers and a space between each pair of adjoining fingers). A word line plate may be coupled with a word line decoder (e.g. row decoder 220) via an electrode that may be operable to apply a voltage to the word line plate for accessing associated memory cells. In order to reduce a footprint of supporting circuitry for a memory device, two word line plates in a same plane may share an electrode for activating the word line plates. The two word line plates sharing the electrode may be (or alternatively include) a page for accessing memory cells 205 (e.g., a logical page for accessing memory cells).

A memory cell 205 may be accessed via a first voltage applied to a word line plate coupled with the memory cell 205 and a second voltage applied to a pillar (e.g., a vertical electrode structure electrically isolated from the word line plate) couple with the memory cell 205. In some cases, a column line 215 or row line 210 as described with reference to FIG. 2 may correspond to a pillar as described herein. A pillar tile may be associated with multiple word line tiles (e.g., representing one or two word line plates), where a pillar tile may represent a portion of pillars within a memory array that may be accessed using one set of complementary decoders, such as a set of one X-direction pillar decoder and one Y-direction pillar decoder, where the X and Y directions may respectively correspond to access lines coupled with pillar selectors, and which may be described in greater detail elsewhere herein.

Such configurations may support parallel or simultaneous access operations for two or more memory cells 205 within a same page of memory cells 205. For example, a first pillar coupled with a first memory cell 205 associated with (e.g., coupled with) a left-hand word line plate (e.g., first word line plate) of a page may be activated and the first word line plate of the page may be activated. In parallel, a second pillar coupled with a second memory cell 205 associated with (e.g., coupled with) a right-hand word line plate (e.g., second word line plate) of the page may be activated and the second word line plate of the page may be activated. Thus, memory cells 205 respectively associated with the left-hand word line plate and the right-hand word line plate may be accessed in parallel, which may increase access operation speed, data throughput, or both.

Figure 3:
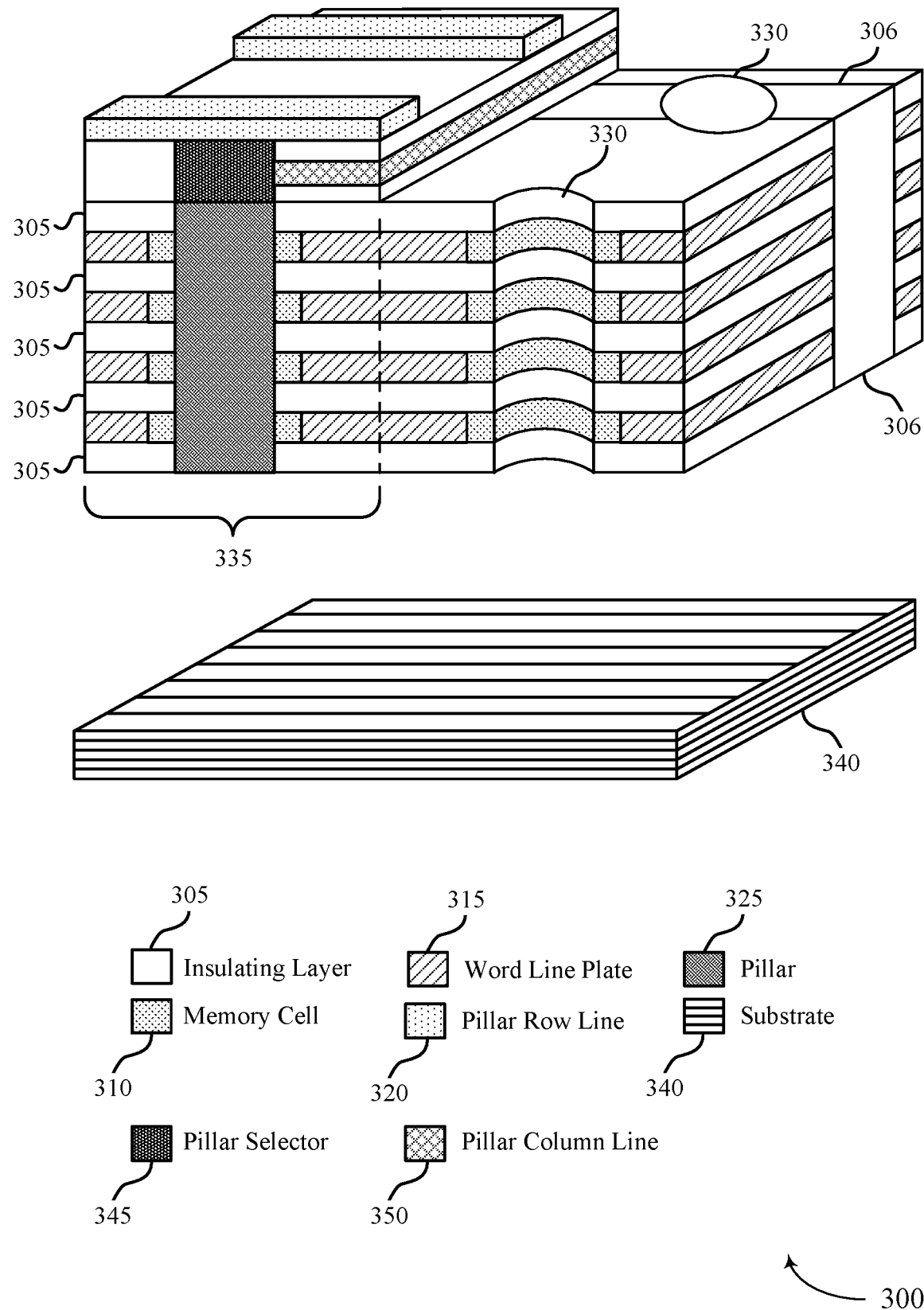
FIG. 3 illustrates aspects of an example of a memory array that supports a decoding architecture for memory devices in accordance with examples as disclosed herein.

FIG. 3 illustrates an example of a memory array 300 that supports a decoding architecture for memory devices in accordance with examples as disclosed herein. Memory array 300 may be an example of memory array described with reference to FIGS. 1 and 2. Memory array 300 may include multiple levels of memory cells 310 stacked in a vertical direction, relative to a substrate, to create memory cell stacks 335, which may be examples of a memory cell and memory cell stack as described with reference to FIGS. 1 and 2. Memory array 300 may thus be referred to, in some examples, as a 3D memory array. Memory array 300 may include word line plates 315 and pillars 325, which may be examples of word lines and bit lines (e.g., row lines 210 and column lines 215) as described with reference to FIG. 2.

A word line plate 315 may include multiple word lines in a "comb" structure (e.g., a structure that may look like a tool with fingers and a space between each pair of adjoining fingers). The word line plate 315 may, for example, include a sheet of conductive material that includes a first portion extending in a first direction within a plane, and multiple fingers extending in a second direction within the plane. Each finger of the word line plate 315 may represent a word line as described herein. A quantity of fingers (e.g., word lines) and a length of the fingers may define a size of a word line plate 315, where the size of the word line plate may be based on a capacitance of the word line plate 315 in relation to one or more storage class memory (SCM) specifications. Various exemplary details of the comb structure, fingers, and other aspects of a word line plate 315 may be further illustrated elsewhere herein.

Each pillar 325 may each be selectively couplable with a respective pillar row line 320 via a pillar selector 345 (e.g., a transistor or a switching component). For example, a pillar column line 350 for a pillar 325 may be coupled with the pillar selector 345 for the pillar 325, and based on the voltage of the pillar column line 350 (e.g., a voltage differential between the voltage of the pillar column line 350 and the voltage of the pillar row line 320), the pillar selector 345 may be selectively activated or deactivated. When activated (e.g., on, closed, conducting), the pillar selector 345 for a pillar 325 may couple the pillar 325 with the pillar row line 320 for the pillar 325, and thus the voltage of the pillar 325 may become equal or approximately equal to the voltage of the pillar row line 320. In some cases, a pillar selector 345 may be a transistor (e.g., a thin-film transistor (TFT) or other type of transistor), and a gate of the transistor may be couple with the pillar column line 350, a source of the transistor may be coupled with the pillar row line 320, and a drain of the transistor may be coupled with the pillar 325. Hence, in some cases, a pillar column line 350 may alternatively be referred to as a pillar gate line, and a pillar row line 320 may alternatively be referred to as a pillar source line. A pillar decoder as described herein may be operable to selectively activate (e.g., apply a selection voltage) or deactivate (e.g., apply a deselection voltage) to a pillar column line 350 out of a set of pillar column lines 350 associated with the pillar decoder, or to selectively activate (e.g., apply a selection voltage) or deactivate (e.g., apply a deselection voltage) to a pillar row line 320 out of a set of pillar row lines 320 associated with the pillar decoder.

Pillar column lines 350 and pillar row lines 320 may span and thus be coupled with the pillar selectors 345 corresponding rows or columns of pillars 325 within a single word line plate, single word line tile, multiple word line plates, or multiple word line tiles as described herein. One of ordinary skill in the art will appreciate that what direction (e.g., the X or Y direction) is considered a row versus a column may be arbitrary. In some cases, a pillar 325 may correspond (e.g., in terms of one or more functionalities) to a column line 215 as described with reference to FIG. 2. Similarly, pillar decoders, pillar column lines 350, pillar row lines 320, and pillar selectors 345 may correspond (e.g., in terms of one or more functionalities) to a column decoder 225 as described with reference to FIG. 2.

In some cases, pillars 325 coupled with the same pillar column line 350 may be considered as a comb structure with vertical comb fingers (e.g., the pillars 325) that are selectable (e.g. individually relative to other pillars 325 coupled with the same pillar column line 350) via respective pillar row lines 320, and each memory cell 320 may be located at the intersection of a horizontal finger of a word line plate 325 (e.g., a word line) and a vertical finger (e.g., a pillar 325, which may be considered a digit line or a portion of a digit line), though the teachings herein are not limited to such conceptualizations.

Memory array 300 may also include insulating layers 305, trench insulating layers 306, vias 330, and substrate 340. While the example of FIG. 3 illustrates pillar row lines 320 and pillar column lines 350 as above the pillars 325, pillar row lines 320 and pillar column lines 350 may alternatively be below the pillars 325 (e.g., between the pillars 325 and the substrate 340) in some implementations.

Insulating layers 305 may be electrically insulating and may provide insulation between alternating word line plates 315. As described herein, various logic states may be stored by programming the electrical resistance of memory cells 310. In some cases, programming the electrical resistance includes passing a current through memory cell 310, heating memory cell 310, melting the material of memory cell 310 (e.g., wholly or partially), applying a voltage of a particular polarity to the memory cell, or any combination thereof. Insulating layers 305 may be composed of multiple sublayers, creating one or more interfaces between memory cells 310.

Memory array 300 may include an array of memory cell stacks 335, and each memory cell stack 335 may include multiple memory cells 310. Memory array 300 may be made by forming a stack of conductive layers, such as word line plates 315, where each conductive layer may be separated from an adjacent conductive layer by one or more electrically insulating layers 305. The electrically insulating layers may include oxide or nitride materials, such as silicon oxide, silicon nitride, or other electrically insulating materials. In some cases, electrically insulating layers 305 may include one or more sublayers. The layers of memory array 300 may be formed on a substrate 340, such as a silicon wafer, or any other semiconductor or oxide substrate. Vias 330 (e.g., openings) may be formed by removing material from the stack of layers through etching or mechanical techniques, or both.

Memory cell 310 (e.g., memory elements) may in some cases be formed by removing material from the conductive layer to create a recess adjacent to a via 330, and forming a variable resistance material in the recess. For example, material may be removed from the conductive layer by etching, and the variable resistance material may be deposited in the resulting recess to form a memory cell 310 (e.g., memory element, which may be a storage element). Each via 330 may be filled with electrical conductor materials and a dielectric material to create a pillar 325, which may be coupled (e.g., selectively, such as using the pillar selector 345) to a pillar row line 320. In other words, memory cells 310 in a memory cell stack 335 may share a common electrode (e.g., a pillar 325). Thus, each memory cell 310 may be coupled with a word line plate 315 and a pillar 325. In some cases, each pillar 325 (e.g., within each via 330) may be coupled with a first word line finger via corresponding first memory cells and a second word line finger via corresponding second memory cells, as described in further detail with reference to FIG. 4. Trench insulating layers 306 may be electrically insulating and may provide insulation between alternating (e.g., interdigited) word line fingers of each word line plate 315 (e.g., word line fingers on each side of a via 330 in the direction of the pillar column lines 320, where word line fingers on opposite sides of a trench insulating layer 306 may extend in parallel but opposite directions away from the spines of their respective word line plates, such as with a first word line finger immediately on one side of the trench insulating layer 306 extending to the right and a second word line finger immediately on the opposite side of the trench insulating layer 306 extending to the left).

In some examples, a material of the memory cells 310 (e.g., memory elements) may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In), or a combination thereof, and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms. Other chalcogenide alloys not expressly recited here may also be employed.

In some examples, such as for thresholding memory cells or self-selecting memory cells 310, some or all of a set of logic states supported by the memory cells 310 may be associated with a same state, such as an amorphous state of the chalcogenide material as opposed to a crystalline state of the chalcogenide material (e.g., the material may be operable to store different or multiple logic states while remaining in an amorphous state). In some such examples, a memory cell 310 may be an example of a self-selecting memory cell 310. In such examples, the material used in the memory cell 310 may be based on an alloy (such as the alloys listed above) and may be operated so as to undergo a state change during normal operation of the memory cell (e.g., due to ion migration or segregation within the memory cell 310). For example, a self-selecting memory cell 310 may have a high threshold voltage state and a low threshold voltage state. A high threshold voltage state may correspond to a first logic state (e.g., a reset state) and a low threshold voltage state may correspond to a second logic state (e.g., a set state). In some examples, a memory cell 310 may alterative be switched between an amorphous and crystalline state during operation, which the amorphous and crystalline states corresponding to different resistances or threshold voltages and thus to different logic states, and such operation may in some cases be referred to as phase change operation.

In some cases, during a programming (write) operation of a self-selecting memory cell 310, a polarity of one or more pulses used for a write operation may influence (determine, set, program) a particular behavior or characteristic of the material of the memory cell 310, such as the threshold voltage of the material. The difference in threshold voltages of the material of the memory cell 310 depending on the logic state stored by the material of the memory cell 310 (e.g., the difference between the threshold voltage when the material is storing a logic state '0' versus a logic state '1') may correspond to a read window of the memory cell 310.

Various techniques may be used to form materials or components on a substrate 340. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a variety of techniques, which may include, for example, chemical etching (also referred to as "wet etching"), plasma etching (also referred to as "dry etching"), or chemical-mechanical planarization.

As described herein, regions separating memory cells 310, for example, insulating layers 305, trench insulating layers 306, or both, may include one or more interfaces. In some examples, the interfaces of the insulating layers 305 separate memory cells 310 stacked in the vertical direction. In other words, memory cells 310 may be stacked one on top of the other and separated from one another by the interfaces. In some examples, the interfaces of the trench insulating layers 306 separate word line fingers from one another in a horizontal direction.

The memory cells 310 described herein may include, but not be limited to, phase change materials. Other types of memory cells 310 may include, for example, resistive memory or resistive RAM. In some cases, resistive RAM may use metal oxide materials whose electrical resistance is varied by controlling the ionic state of atoms in the material or by controlling the quantity or location of atomic vacancies (e.g., missing atoms) in the material.

Figure 4A:
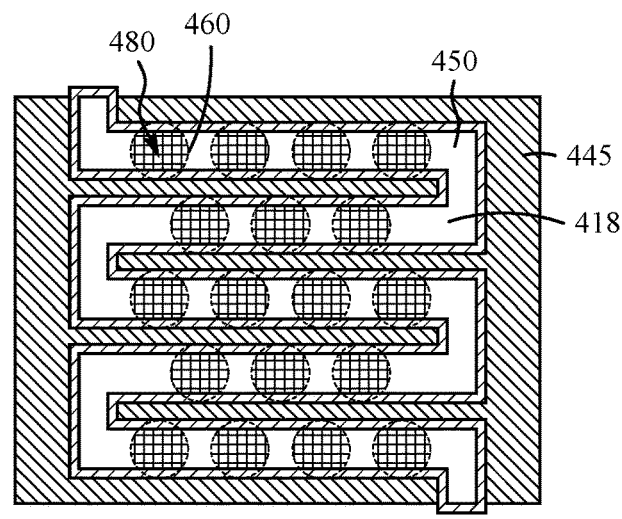
FIGS. 4A and 4B illustrate aspects of examples of memory arrays that support a decoding architecture for memory devices in accordance with examples as disclosed herein.
Figure 4B:
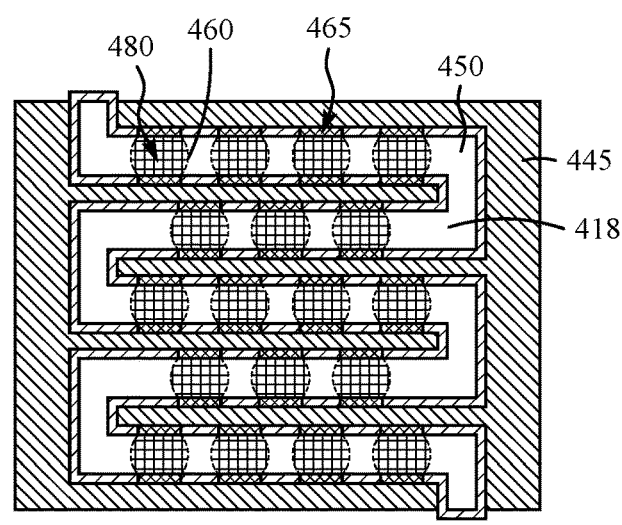

FIGS. 4A and 4B illustrate examples of memory arrays 400-*a* and 400-*b* that support a decoding architecture for memory devices in accordance with examples as disclosed herein. For example, FIGS. 4A and 4B illustrate various views of example 3D memory arrays 400-*a* and 400-*b*, which may be examples of 3D memory arrays in accordance with examples as disclosed herein. Multiple openings 460 may be formed through the alternating planes of a conductive material 445 (e.g., word lines planes or word line plates), a dielectric material 418, and a second dielectric material, for example, in a trench 450. As shown, the diameter of the multiple openings 460 may be approximately the same width of the trench 450. In some examples, the diameter of the multiple openings 460 may be greater than the width of the trench 450.

Each of the multiple openings 460 may be approximately concentric with a different respective conductive contact. As shown in FIGS. 4A and 4B, a pillar 480 (e.g., circular pillar 480) may be formed in each respective opening 460 in a geometric pattern, for example, formed over and coupled with a respective conductive contact (e.g., which may be or be coupled with a pillar selector 345). In some examples, the openings 460 (e.g., and corresponding pillars 480) may be square or another shape. In some cases, the multiple openings 460 may have a staggered (e.g., hexagonal) arrangement of conductive contacts associated with the pillars 480. For example, a respective conductive contact may be surrounded by six other conductive contacts.

A staggered pattern may refer to any pattern where positions of objects (e.g., contacts, openings 460, or pillars 480) in a first row are offset from positions of objects (e.g., contacts, openings 460, or pillars 480) in a second row adjacent to the first row in a given direction. For example, a staggered pattern may have objects (e.g., contacts, openings 460, or pillars 480) adjacent to one another in the x-direction (e.g., rows or a horizontal direction), but not in the y-direction (e.g., columns or a vertical direction). For instance, as illustrated in FIGS. 4A and 4B, conductive contacts may be adjacent to each other and in line with each other in an x-direction. However, the conductive contacts may not be adjacent to each other in the y-direction and may, for example, alternate (e.g., skip) rows in the y-direction. Although FIGS. 4A and 4B show spacing that is approximately the same between the conductive contacts throughout a substrate, examples in accordance with the present disclosure are not limited to such. For example, the spacing between the conductive contacts may vary throughout the substrate.

FIG. 4B shows that the 3D memory array may include multiple storage element materials 465, each including a chalcogenide material or other storage element positioned between at least one word line plate, at least one pillar 480, and at least one dielectric material 418. In some examples (e.g., depending on the decoding optimization), each pillar 480 may be coupled with a respective selector (e.g., a switching element, such as a transistor) positioned at a top, a bottom, or both a top and a bottom (e.g., below or above a plurality of word line plates) of the 3D memory array 400.

Figure 5A:
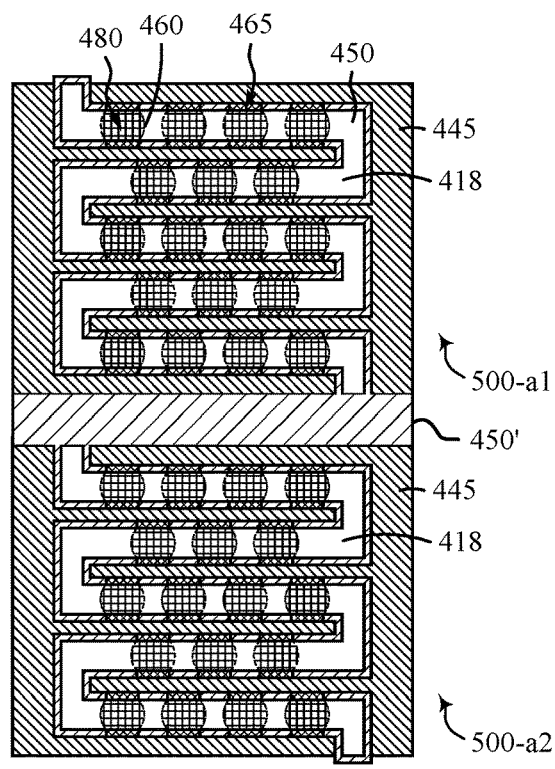
FIGS. 5A. 5B, and 5C illustrate aspects of examples of memory arrays that support a decoding architecture for memory devices in accordance with examples as disclosed herein.
Figure 5B:
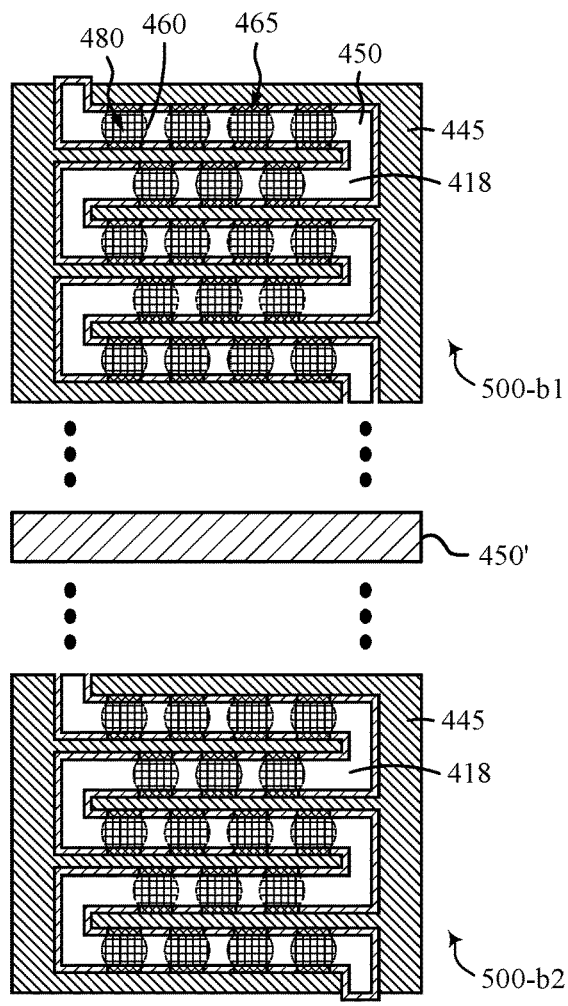
Figure 5C:
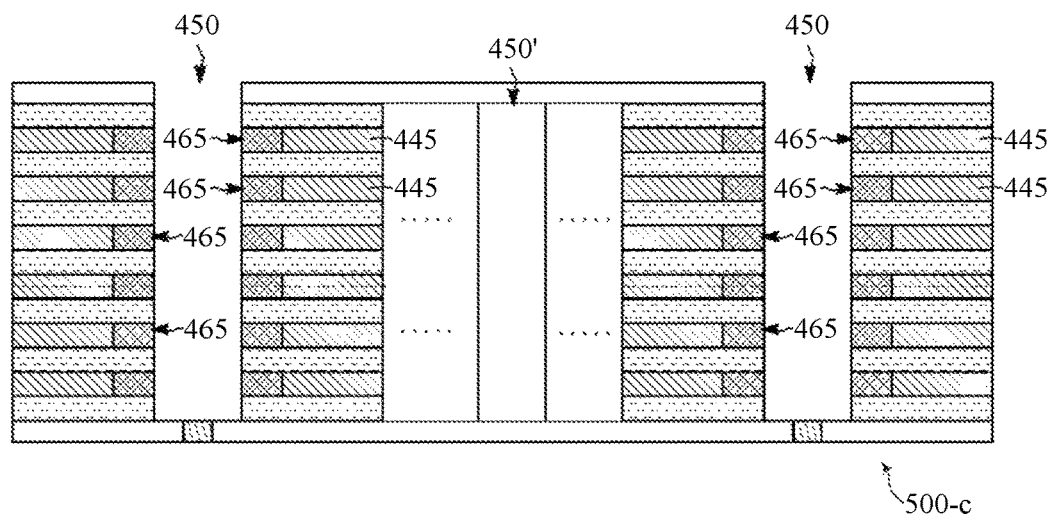

FIGS. 5A, 5B, and 5C illustrate examples of memory arrays 500-*a*, 500-*b*, and 500-*c* that support a decoding architecture for memory devices in accordance with examples as disclosed herein. For example, FIGS. 5A, 5B, and 5C may illustrate various views of example 3D memory arrays 500-*a*, 500-*b*, and 500-*c*, which may be examples of 3D memory arrays in accordance with examples as disclosed herein. The memory arrays 500-*a*, 500-*b*, and 500-*c* may include similar features to a memory array 400 described with reference to FIGS. 4A and 4B. A particular separation trench 450', which may be filled with an insulation material or a dielectric material, may be formed between two sub-arrays (e.g., a first sub-array 500-*a*1 and a second sub-array 500-*a*2), such that the first sub-array 500-*a*1 and the second sub-array 500-*a*2 may be isolated from each other electrically. In some examples, the memory array 500-*a* may include a plurality of vertically stacked word line plates separated from one another with respective dielectric layers (refer to the side view of the memory array shown in FIG. 5C).

Word line plates may be formed by conductive material 445 of memory arrays 500-a, 500-b, and 500-c, where each word line plate may include multiple word lines. In the first sub-array 500-a1, a first set of word lines associated with a first word line plate may be isolated from a second set of word lines associated with a second word line plate using a dielectric material extending in a serpentine shape (e.g., a shape of a trench 450). In the second sub-array 500-a2, a third set of word lines associated with a third word line plate may be isolated from a fourth set of word lines associated with a fourth word line plate using a dielectric material extending in a serpentine shape (e.g., a shape of a trench 450). The first set of word lines and the second set of word lines may be isolated from the third set of word lines and the fourth set of word lines by the separation trench 450'. One separation trench 450' is illustrated in FIGS. 5A through 5C, which is for illustration purposes. The quantities of the separation trenches 450' and the sub-arrays 500-a1 and 500-a2 may not be limited to the quantities illustrated in FIGS. 5A through 5C. For example, multiple separation trenches 450' may be formed in a 3D memory array as needed (e.g., to isolate various sub-arrays of the 3D memory array).

With the separation trench 450' filled with an insulation material or a dielectric material, which may also be referred to as a separation layer, a power consumption of a 3D memory array may be reduced while meeting an SCM specification. For example, compared to a 3D memory array in which multiple sub-arrays are coupled with each other, a 3D memory array with serval separation layers interposed may experience a corresponding drop in a capacitance value of the memory array (e.g., of the individual sub-arrays) and the power consumption may also be further reduced without increasing a decoding burden.

As shown in FIG. 5A, in some examples, after forming the trench 450 in a serpentine shape in the 3D memory array 500-a, a portion of the trench 450 may be selected as the separation trench 450', which may be used to divide the 3D memory array 500-a into the first sub-array 500-a1 and the second sub-array 500-a2. For example, the separation trench 450' may be subjected to a further etch operation such that the two sub-arrays on both sides of the particular separation trench 450' may be separated, which may sever one or more word line plate structures to create separate word line plates or sets of word line plates on either side of the separation trench 450'. In some examples, during the subsequent processing steps, the separation trench 450' may be filled with an insulative material or dielectric material, for example, without any other material such as a storage element material or a conductive material formed therein. In some examples, a portion from the serpentine trench 450 may be used as the separation trench 450' between different sets of word lines (e.g., every X word lines, where X is some quantity).

In another example, a plurality of sub-arrays may be formed in a same substrate and a separation layer 450' may be deposited on one or both sides of each sub-array in horizontal direction of the serpentine shaped trench 450, such that the plurality of sub-arrays may be isolated from each other electrically. In another example, after forming a 3D memory array and based on one or more dimensions of the 3D memory array, a quantity of separation trenches 450' may be formed along a plane parallel to both a digit line and a word line to cut the 3D memory array into a plurality of sub-arrays, where an etch operation may be performed on the memory array to form the separation trenches 450'.

A position where a separation trench 450' (or a separation layer 450') is formed may be adjusted according to the dimension of 3D memory array, as illustrated by FIGS. 5B and 5C. For example, a cross-sectional area of the memory array shown in FIG. 5B may be 120 μm×120 μm. It is to be understood that these and any other specific numeric quantities provided herein are examples provided solely for the sake of illustrative clarity and are not limiting of the claims. In some examples, the 3D memory array may be formed based on example pitches of adjacent pillars.

In some examples, insertion of the separation layers 450' may aid in the corresponding capacitance value being sufficiently low that the word line may be biased by a driver consuming a desirably low amount of energy (e.g., a first order computation of the energy to drive the word line may in some cases be ($\frac{1}{2}$ CV$^2$)). Additionally, dividing of the 3D memory array using pillars may allow the decoding circuitry under array (CuA) optimization, for example minimizing a quantity of pillar decoders, sense amplifiers, or the like, while SCM specifications may be met based on memory array segmentation at a higher level (e.g., word line cutting due to the insertion of the separation layers 450').

In some examples, depending on the decoding implementation, each pillar 480 may be coupled with a respective selector (e.g., a switching component or transistor) located at a top, a bottom, or both a top and a bottom (e.g., below or above the plurality of word line plates) of the 3D memory arrays. Spatially related terms, including but not limited to, "top," "bottom," "lower," "upper," "beneath," "below," "above," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Figure 6:
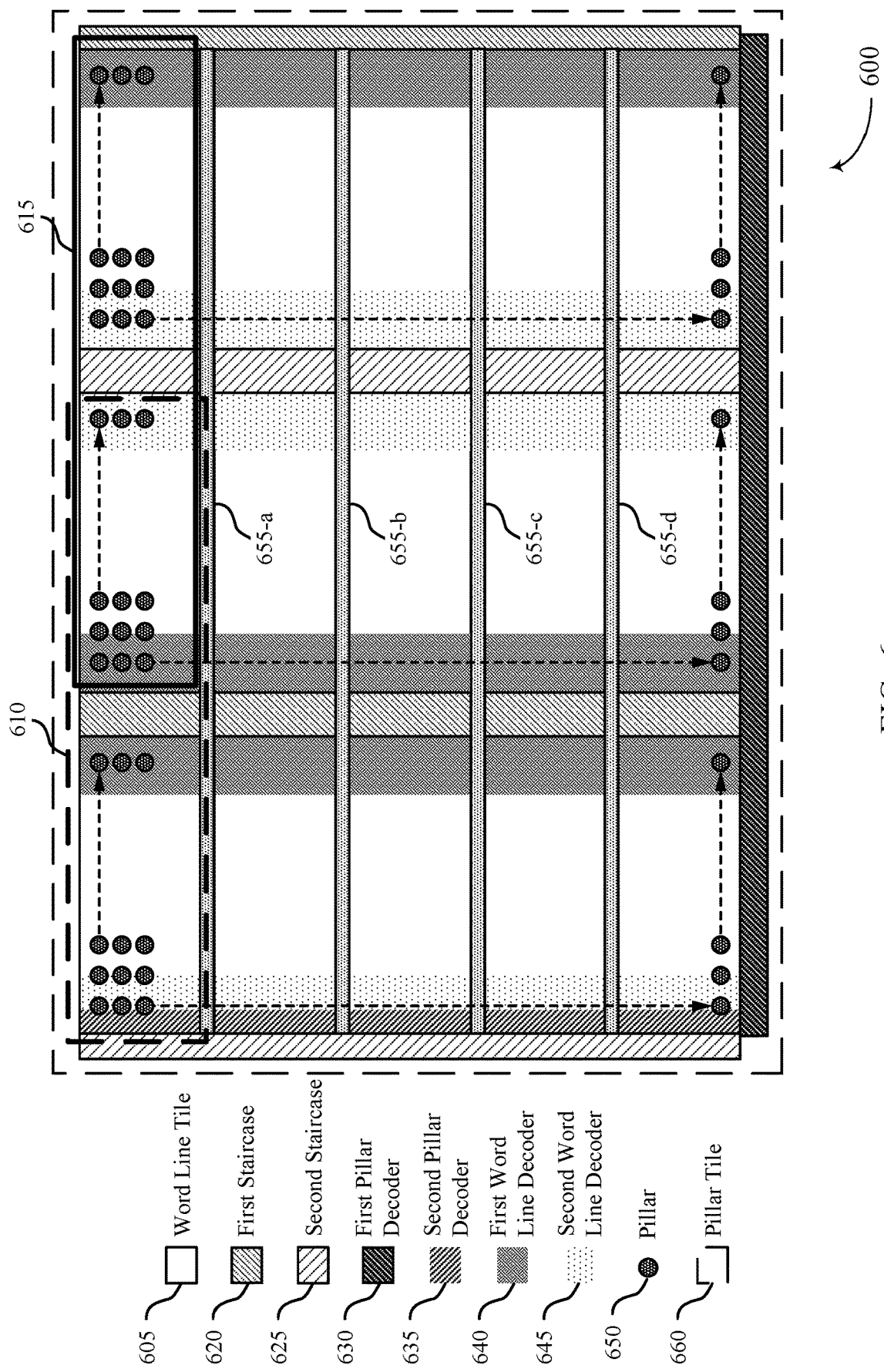
FIG. 6 illustrates an example of an array architecture that supports a decoding architecture for memory devices in accordance with examples as disclosed herein.

FIG. 6 illustrates an example of an array architecture 600 that supports a decoding architecture for memory devices in accordance with examples as disclosed herein. Array architecture 600 may represent an array that includes multiple pillars 650, which may represent examples of a pillars described with reference to FIGS. 3-5. For example, each pillar 650 may extend through a stack of materials that includes alternating layers of dielectric or insulating material and word line plates. Each pillar 650 may also be coupled with one or more memory cells (e.g., two memory cells) at each word line plate layer. The view illustrated by FIG. 6 may represent a top or bottom view of the array, such that the pillars 650 may extend in and out of the page. The pillars 650 may extend in rows and columns throughout the array architecture 600, for example, including locations not illustrated by FIG. 6 (e.g., pillar columns and rows may largely fill each word line tile 605). Although the pillars 650 are shown arranged in a linear fashion, the pillars 650 may additionally or alternatively be arranged in another geometric pattern (e.g., staggered), as described with reference to FIGS. 4 and 5.

Array architecture 600 may include multiple word line tiles 605, which may each represent a set of word lines separated from word lines of other word line tiles 605, for example, by staircases 620 and 625 and by slots 655. Each word line tile 605 may include two independently addressable word line plates, which may face each other (e.g., as interlocking comb structures, which may alternatively be referred to as combs with interdigited fingers, though such details may be omitted in FIG. 6 and illustrated in greater detail elsewhere for the sake of clarity with respect to other details illustrated in FIG. 6), and which may be separated by dielectric or insulating material in a serpentine or other shape as described with reference to FIGS. 4 and 5. Additionally or alternatively, a word line tile 605 may represent a quantity or arrangement of memory cells that are reachable by one comb of a word line plate. The word line plates within a word line tile 605 may be located at alternating layers of the stack of materials, as described with reference to FIG. 3, such that a word line plate of the array architecture 600 may be located above or below one or more other word line plates of the same word line tile 605.

A size of a word line tile 605 (e.g., a length and width, based on a quantity and length of fingers of associated word line plates) may be based on a capacitance of the word line tile 605 or the word line plates therein with relation to one or more SCM specifications (e.g., may be sized to meet the SCM specification(s)).

Different word lines plates (and thus different word lines) at different levels of the stack and at different locations of the array architecture 600 may be accessed or activated using word line decoding circuitry (e.g., a word line decoder 640 or 645). A word line decoder 640 or 645 may, for example, activate the word lines of one or more word line plates via a staircase 620 or 625 (e.g., an electrode or a series of electrodes with varying heights). Similarly, different pillars 650 may be accessed or activated using pillar decoding circuitry (e.g., pillar decoders 630 and 635), which may activate or access a bit line and a gate line (e.g., a pillar gate line) associated with a specific pillar 650.

In order to reduce a footprint of CuA and other peripheral or supporting circuitry for the array architecture 600, two word line plates of different word line tiles 605 may share a staircase 620 or 625. The two word line plates sharing an electrode within the staircase 620 or 625 may be (or alternatively include) a page 610 or 615 for accessing memory cells (e.g., a logical page for accessing memory cells) at a same level of the array architecture 600. For example, a first page 610 (e.g., an even page) may include two first word line plates extending out (e.g., to the left and right) away from a first staircase 620 and a second page 615 (e.g., an odd page) may include two second word line plates extending out (e.g., to the left and right) away from a second staircase 625. Thus, for example, the word lines or fingers of a right-extending word line plate of the first page 610 may interlock with (but be separated from by a serpentine trench) the word lines or fingers of left-extending word line plate of the second page 615.

In some examples, with reference to FIG. 6, a first word line decoder 640 or second word line decoder 645 for a word line tile 605 may be operable to activate a selected word line plate out of the set of vertically stacked word line plates within the word line tile 605. For example, a first word line decoder 640 may be operable to activate a first selected word line plate within a first word line tile 605 to the left of a first staircase 620 (e.g., to the left of a staircase region where the output of the first word line decoder 640 may be signaled) and to activate (e.g., concurrently) a second selected word line plate within a second word line tile 605 to the right of the first staircase 620 (e.g., to the right of the staircase region where the output of the first word line decoder 640 may be signaled) of the first word line decoder 640 (e.g., and at a same level as the first word line plate). For example, the first selected word line plate within the first word line tile 605 to the left of the first staircase 620 and the second selected word line plate within the second word line tile 605 to the right of the first staircase 620 may both be coupled with a same electrode within the first staircase 620, and thus the first word line decoder 640 may select the two word line plates within the two adjacent word line tiles, and thus a corresponding page 610, by applying a select voltage to the shared electrode within the first staircase 620 for the two word line plates. A second word line decoder 645 may similarly be operable to activate a first selected word line plate within a first word line tile 605 to the left of the second staircase 625 (e.g., to the left of the staircase region where the output of the second word line decoder 645 may be signaled) and to activate (e.g., concurrently) a second selected word line plate within a second word line tile 605 to the right of the second staircase 625 (e.g., to the right of the staircase region where the output of the second word line decoder 645 may be signaled)—e.g., by applying a select voltage to an electrode within the second staircase 625 that is coupled with the two selected word line plates and thereby selecting a corresponding page 615 of memory cells.

In some examples, a page 610 or 615 may include a same quantity or approximately a same quantity of memory cells as included within a word line tile 605, for example, based on being able to concurrently access half of the memory cells associated with two different word line tiles 605 (e.g., via the respective first or second word line plates of those two word line tiles 605). Sharing an electrode of a staircase 620 or 625 between two word line plates may reduce (e.g., may halve) a quantity of total staircase electrodes and a quantity of total word line decoders 640 and 645 associated with array architecture 600, for example, in comparison with architectures in which word line plates within adjacent word line tiles 605 do not share electrodes (e.g., in which staircases are dedicated to only a single word line tile 605, versus pairs or other sets of word line tiles 605).

Each first word line plate may be selectively activated using a respective first word line decoder 640 (e.g., first decoding circuitry) and each second word line plate may be selectively activated using a respective second word line decoder 645. In some examples, to activate a first word line plate (or a pair of first word line plates), a first word line decoder 640 may activate or apply a voltage to a corresponding electrode within a first staircase 620. Similarly, to activate a second word line plate (or a pair of second word line plates), a second word line decoder 645 may selectively activate or apply a voltage to a corresponding electrode within a second staircase 625.

Similarly, to reduce the footprint of CuA and other peripheral or supporting circuitry for the array architecture, a pillar tile 660 may be associated with multiple word line tiles 605 (e.g., any quantity of word line tiles 605, such as 15 or 16 word line tiles 605). In some cases, a pillar tile 660 may include or be associated with a non-integer quantity of word line tiles 605 (e.g., based on the independence between word line tiles 605 and pillar tiles 660), for example, based on one or more connectivity and spacing constraints (e.g., to decrease crowding a connectivity between the array and CuA). A pillar tile 660 may represent a portion of the pillars 650 of the array architecture 600 that may be accessed using one set of complementary decoders, such as a set of one X-direction pillar decoder for decoding pillar lines that that run in the Y direction (e.g., a first pillar decoder 630 for decoding pillar column lines) and one Y-direction pillar decoder for decoding pillar lines that that run in the X direction (e.g., a second pillar decoder 635 for decoding pillar row lines).

A pillar tile 660 may define (e.g., independently from the boundaries of a word line tile 605) a total area (e.g., maximum area) of pillars 650 and associated memory cells that may be decoded using a first pillar decoder 630 (e.g., in an X direction) and corresponding second pillar decoder 635 (e.g., in a Y direction). A size of a pillar tile 660 (e.g., a length and width, based on a length of the pillar decoders 630 and 635 and an associated quantity of pillars 650) may be based on a capacitance of the pillar tile 660 with relation to one or more SCM specifications (e.g., may be sized to meet the SCM specification(s)).

The first pillar decoder 630 and the second pillar decoder 635 (e.g., pillar decoding circuitry) may be used to selectively access a pillar 650 within the pillar tile 660. For example, the first pillar decoder 630 may be used to access or activate a pillar column line and the second pillar decoder 635 may be used to selectively access or activate a pillar row line. The pillar column line may activate one or more switching components coupled with the pillar column line, which may couple the activated pillar row line and thereby select or activate a pillar 650 associated with the activated pillar column line and the activated pillar row line (e.g., because a switching component, such as a pillar selector 345, may be activated based on a difference between the voltage of the corresponding pillar column line and the voltage of the corresponding pillar row line, which may be coupled with a source or drain of the switching component where, for example, the switching component is or includes a transistor). A voltage may be applied to the pillar 650 via the pillar row line.

In some cases, the first pillar decoder 630 and the second pillar decoder 635 may represent areas for contacting other decoders that may operate at a more global level (e.g., device-level), for example, if a multiple thin film transistor decoder is located below each pillar 650 (e.g., for coupling the pillar 650 and a pillar row line to activate the pillar 650, as a pillar selector 345). In cases where a single thin film transistor is located below each pillar 650, the first pillar decoder 630 and the second pillar decoder 635 may represent a decoding level for the pillars of the pillar tile 660.

Associating a pillar tile 660 with multiple word line tiles 605 (e.g., such that the pillar tile 660 is larger than the word line tiles 605 and includes memory cells within multiple word line tiles 605) may reduce a footprint of pillar decoders 630, for example, by supporting one pillar decoder 630 for all of the pillars 650 of the pillar tile 660 (e.g., as opposed to one pillar decoder 630 for each word line tile 605).

A memory cell may be accessed (e.g., for a read or a write operation) by activating a corresponding pillar 650 and word line plate. For example, a first voltage may be applied to a pillar column line and a second voltage may be applied to a pillar row line to activate or access a corresponding pillar 650 (e.g., at an intersection of the pillar column line and the pillar row line). Similarly, a third voltage may be applied to a word line plate (e.g., the word line plate may be activated) to access a memory cell coupled with the activated pillar 650. For example, the memory cell may be coupled with the word line plate and with the pillar 650 and may be accessed based on the respective voltages applied to the word line plate and the pillar 650.

In some cases, array architecture 600 may support parallel or simultaneous access operations for two or more memory cells within a same page 610 or 615 (e.g., two or more memory cells coupled with pillars 650 in a same column of pillars 650), which may increase access operation speed and/or data throughput. In some cases, two or more memory cells associated with a same column of pillars 650 may be concurrently accessed so long as memory cells on opposite sides of a same word line finger are not concurrently accessed. For example, within a pillar tile 660, one pillar column line may be activated, and every other pillar row line (or some other subset of pillar row lines in which no two pillar row lines are adjacent) may be concurrently activated, thereby concurrently activating every other pillar 650 within a column of pillars 650 (or some other subset of pillars 650 in which no two activated pillars within the column are adjacent). In some such cases, one word line plate per word line tile 605 may be activated at a time (e.g., for a given activated pillar 650, one memory cell may be accessed based on concurrently activating, out of multiple vertically stacked word line plates coupled with memory cells that are coupled with the pillar 650, the word line plate coupled with the one memory cell). And in some cases, word line plates within any quantity of even pages 610 or odd pages 615 may be concurrently activated, thus supporting concurrent access of two or more memory cells associated with a same column of pillars 650 across any quantity of word line tiles 605.

Additionally or alternatively, in some cases, array architecture 600 may support partially parallel access operations for two or more memory cells within a same page 610 or 615 (e.g., two or more memory cells coupled with pillars 650 in a same row of pillars 650), which may increase access operation speed and/or data throughput. For example, within a pillar tile 660, a first pillar column line may be activated, and every other pillar row line (or some other subset of pillar row lines in which no two pillar row lines are adjacent) may be concurrently activated, thereby concurrently activating every other pillar 650 within a first column of pillars 650 (or some other subset of pillars 650 in which no two activated pillars within the first column are adjacent). One or more word line plates may also be concurrently activated to access memory cells coupled with the activated pillars 650 within the first column. Subsequently, the first pillar column line may be deactivated, and a second pillar column line may be activated, possibly while the one or more word line plates remain activated. Thus, different memory cells coupled with pillars 650 in different columns of pillars 650 may be accessed while the one or more word line plates remain activated, based on activating different pillar column lines in sequential fashion. In some cases, the same one or more pillar row lines may also remain activated while the one or more word line plates remain activated, such that different memory cells coupled with different pillars 650 in the same one or more rows of pillars 650 but different columns of pillars 650 may be accessed in partially parallel fashion (e.g., while a same set of one or more word line plates remains activated, while a same set of one or more pillar row lines remains activated, or both). And in some cases, different pillar row lines may be activated as different pillar column lines are activated, such that different memory cells coupled with different pillars 650 in different rows of pillars 650 and different columns of pillars 650 may be accessed in partially parallel fashion. In some cases, such partially parallel access may occur for two or memory cells distributed across the left-hand word line plate and the right-hand word line plate of a page 610 or page 615.

Figure 7:
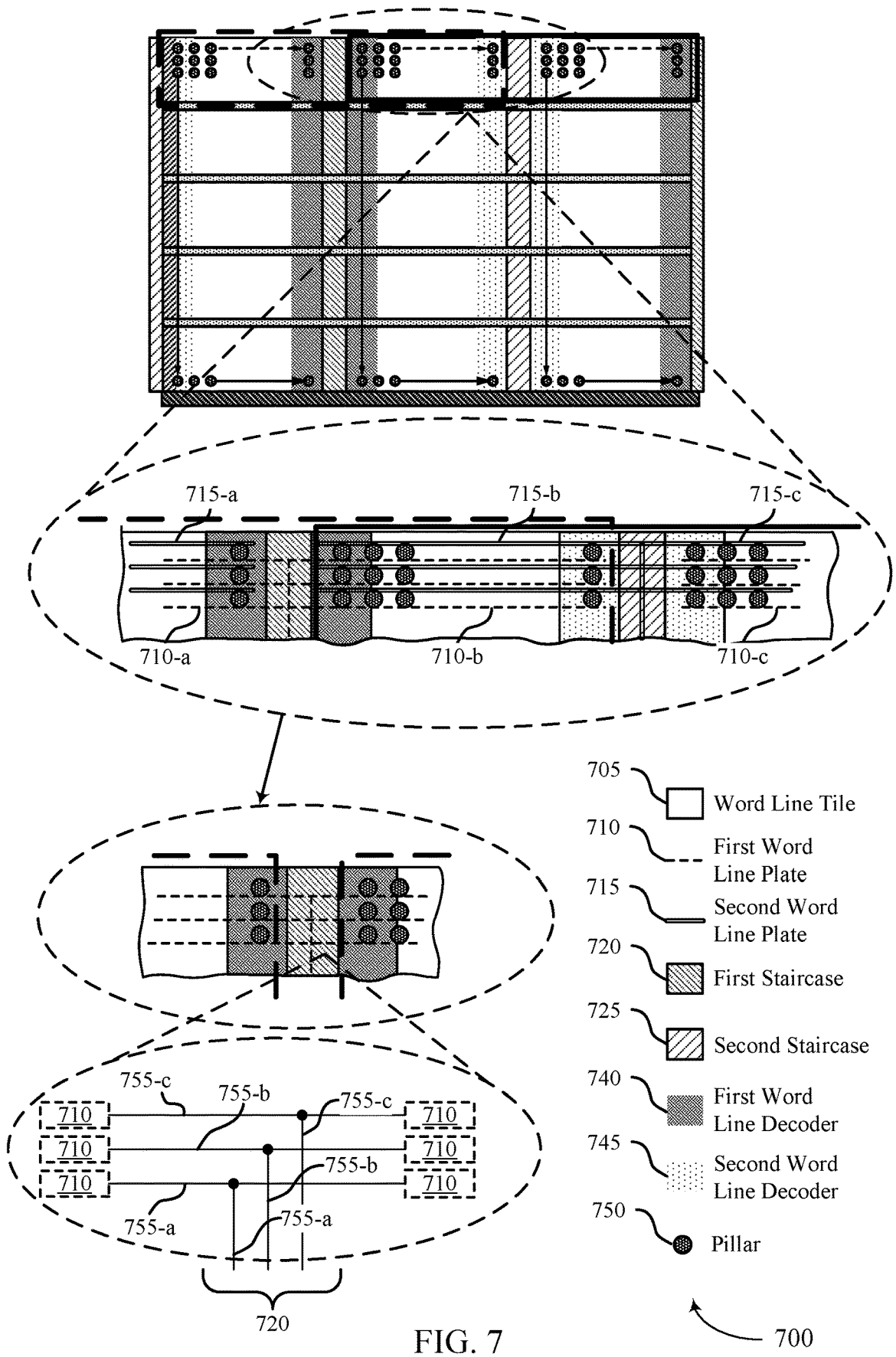
FIG. 7 illustrates an example of an array architecture that supports a decoding architecture for memory devices in accordance with examples as disclosed herein.

FIG. 7 illustrates an example of an array architecture 700 that supports a decoding architecture for memory devices in accordance with examples as disclosed herein. Array architecture 700 may represent various examples of array architecture 600. For example, array architecture 700 may include word line tiles 705, word line plates 710 and 715, staircases 720 and 725, word line decoders 740 and 745, and pillars 750, which may represent examples of the corresponding components described elsewhere herein, including with reference to FIG. 6.

A staircase 720 or 725 as described herein may include multiple electrodes 755, where each electrode 755 may be coupled with a different level of word line plates 710 or 715. Thus, by activating one electrode 755 of the staircase 720 or 725, word line plates 710 or 715 may be activated at a level of the staircase corresponding to the activated electrode 755. The diagram of FIG. 7 showing an example first staircase 720 is from a side perspective, whereas the other diagrams of FIG. 7 are from a top-down perspective. Further, though an example first staircase 720 is illustrated, it is to be understood that a second staircase 725 may have identical structure, but the electrodes 755 thereof may instead be coupled with second word line plates 715.

With reference to two adjacent word line tiles 705, a first staircase 720 between the two word line tiles 705 may include a first electrode 755-a, a second electrode 755-b, and a third electrode 755-c, where each electrode 755 may represent one or more electrodes coupled together. For example, the first electrode 755-a may include a horizontal portion coupled with a first level of word line plates 710, and a vertical portion coupled with the horizontal portion (e.g., operable to activate the horizontal portion). Electrodes 755-b and 755-c may likewise include respective horizontal and vertical portions and be operable to activate a respective level of word line plates 710. The first electrode 755-a may be coupled with a first pair of word line plates 710 at a first level of the array architecture 700, for example, to the left and right of the associated first staircase 720. Similarly, the second electrode 755-b may be coupled with a second pair of word line plates 710 at a second level of the array architecture 700 (e.g., above the first level), and the third electrode 755-c may be coupled with a third pair of word line plates 710 at a third level of the array architecture 700 (e.g., above the second level). It is to be understood that the array architecture 700 may include within a word line tile 705 any quantity of levels of word line plates 710 and 715, and corresponding levels of associated staircases 720 and 725, without departing from the scope of the present disclosure.

The vertical electrodes 755 of a first staircase 720 may be coupled with and selectively activated or deactivated by a first word line decoder 740, and the vertical electrodes 755 of a second staircase 725 may be coupled with and selectively activated or deactivated by a second word line decoder 745. In the example of the illustrated first staircase 720, a first word line decoder 740, for example, may activate a selected level of word line plates 710 coupled with a corresponding electrode 755 of the first staircase 720. For example, the first word line decoder 740 may activate a portion of the first staircase 720 corresponding to electrode 755-a (e.g., may apply a voltage to a vertical portion of electrode 755-a), which may activate the top level word line plates 710 (e.g., apply the voltage to the top level word line plates 710). Similar techniques may be used to activate other levels of word line plates 710, for example, via other corresponding electrodes 755 or portions of the first staircase 720.

As described with reference to FIG. 6, two word line plates 710 or 715 at a same level may share a respective staircase 720 or 725 (e.g., a portion thereof, such as an electrode 755), which may reduce a footprint of CuA and other peripheral or supporting circuitry for the array architecture 700. For example, two first word line plates 710-a and 710-b may be coupled with and share a first staircase 720 and two second word line plates 715-b and 715-c may be coupled with and share a second staircase 725. In such examples, first word line plates 710-a and 710-b may be located at a same level and may be coupled with a same portion (e.g., same electrode 755) of the first staircase 720. Similarly, second word line plates 715-a and 715-b may be located at a same level and may be coupled with a same portion (e.g., same electrode 755) of the second staircase 725. Other first word line plates 710 (e.g., located above or below first word line plates 710-a and 710-b) may be coupled with different respective portions (e.g., electrodes 755) of the first staircase 720. Similarly, other first word line plates 715 (e.g., located above or below first word line plates 715-b and 715-c) may be coupled with different respective portions (e.g., electrode 755) of the second staircase 725.

Each first word line plate 710 may be activated using a respective first word line decoder 740 (e.g., first decoding circuitry) and each second word line plate may be activated using a respective second word line decoder 745 (e.g., second decoding circuitry). For example a first word line decoder 740 may be operable to activate word line plates 710-a and 710-b (e.g., concurrently) via a shared portion (e.g., electrode 755) of a first staircase 720. Similarly, a second word line decoder 745 may be operable to activate word line plates 715-b and 715-c (e.g., concurrently) via a shared portion (e.g., electrode 755) of a second staircase 725. In some examples, the first word line decoders 740 may activate or apply a voltage to a corresponding portion (e.g., electrode 755) of the first staircase 720 to activate the word line plate(s) 710 and the second word line decoders 745 may activate or apply a voltage to a corresponding portion (e.g., electrode 755) second staircase 725 to activate the word line plate(s) 715.

The word line decoders 740 and 745 may, in some cases, include semiconductor circuitry (e.g., silicon circuitry) which may provide such a voltage bias to the respective word line plates 710 or 715 (e.g., apply the voltage to two word line plates via a corresponding staircase 720 or 725). In some cases, the increased quantity of word line plates 710 and 715 biased by the word line decoders 740 and 745 may increase a capacitance associated with such structures and may decrease an amount of total area (e.g., transistor area) taken up by the word line decoders 740 and 745.

Sharing a staircase 720 or 725 between two word line plates 710 or 715 may reduce (e.g., may halve) a quantity of total staircases and a quantity of total word line decoders 740 and 745 associated with array architecture 700, for example, in comparison with architectures that do not share staircases. The two word line plates 710 or 715 sharing a same electrode 755 of a respective staircase 720 or 725 may represent a page for accessing memory cells. For example, a first page (e.g., an even page) may include first word line plates 710-a and 710-b coupled with and extending from a first staircase 720 and a second page (e.g., an odd page) may include second word line plates 715-b and 715-c coupled with and extending from a second staircase 725.

In some cases, array architecture 700 may support parallel or simultaneous access operations, partially parallel access operations, or any combination thereof for two or more memory cells within a same page. For example, a set of memory cells coupled with a same word line plate (or set of word line plates having a shared staircase 720 or 725) and pillars within a same column of pillars (e.g., pillars coupled with a same pillar column line) may be concurrently accessed, in some cases provided the set of memory cells does not include memory cells on opposite sides of a same word line finger. As another example, a set of memory cells coupled with a same word line plate (or set of word line plates having a shared staircase 720 or 725) and pillars within a same row of pillars (e.g., pillars coupled with a same pillar row line) may be accessed while maintaining the word line plate (or set of word line plates having a shared staircase 720 or 725) as activated (e.g., without intermittently deactivating and reactivating the word line plate) based on sequentially activating different pillar column lines. Such techniques may increase access operation speed and/or data throughput, among other benefits that may be appreciated by one or ordinary skill in the art.

Figure 8:
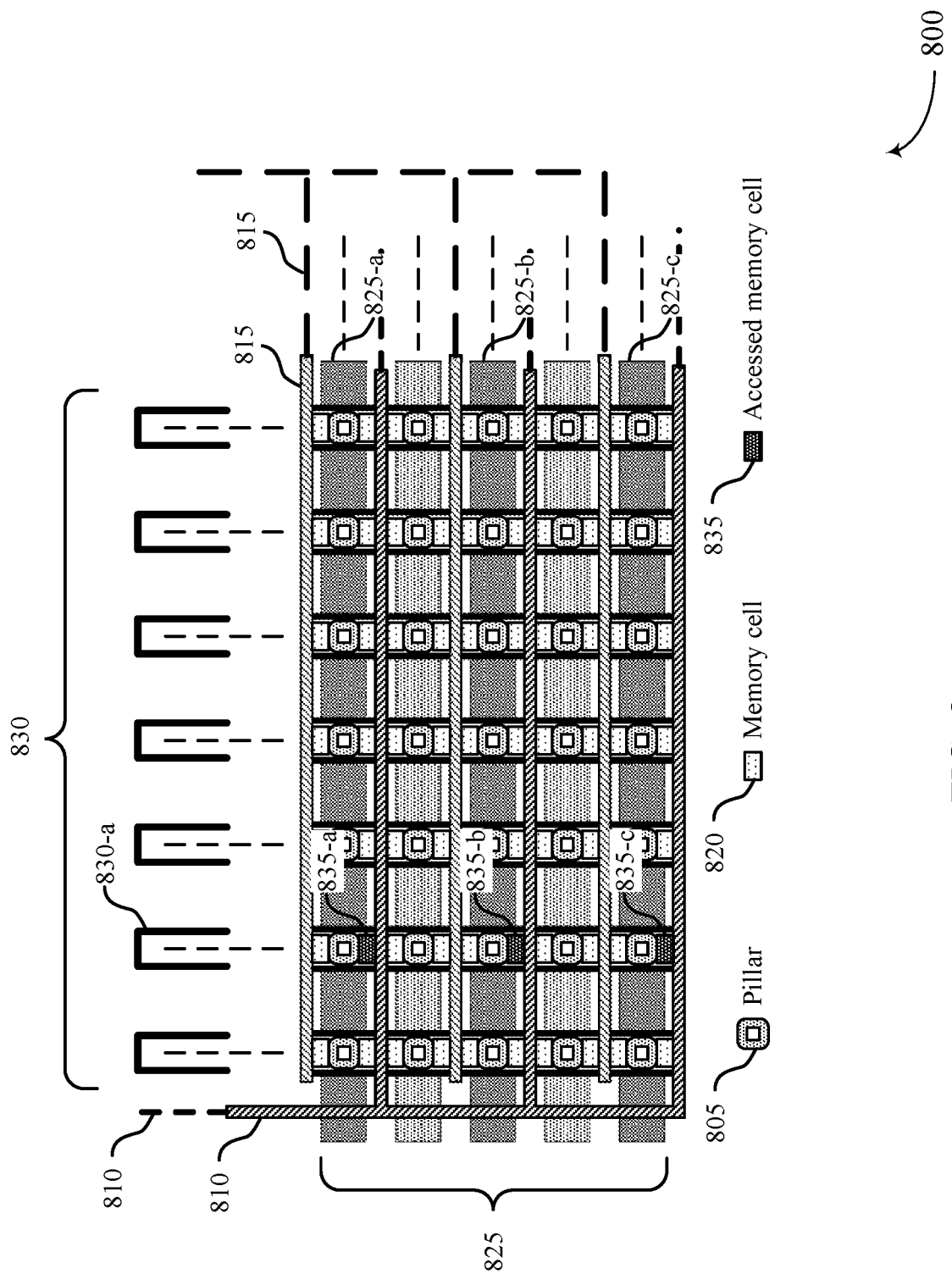
FIG. 8 illustrates an example of an array architecture that supports a decoding architecture for memory devices in accordance with examples as disclosed herein.

FIG. 8 illustrates an example of an array architecture 800 that supports a decoding architecture for memory devices in accordance with examples as disclosed herein. Array architecture 800 may represent various examples of array architecture 600 or array architecture 700. For example, array architecture 800 may include pillars 805, first word line plates 810, second word line plates 815, memory cells 820, pillar row lines 825, and pillar column lines 830, which may represent examples of the corresponding components described elsewhere herein, including with reference to FIG. 6. Array architecture 800 may represent a top view of a memory array and may illustrate pillar row lines 825 and pillar column lines 830 above or below the array, as well as word line plates 810 and 815 at one level of the array. The pillars 805 may be oriented such that they extend in and out of the page.

As described with reference to FIG. 6, a pillar tile may represent a portion of the pillars 805 of the array architecture 800 that may be accessed using one set of decoders (e.g., a pillar row line decoder and a pillar column line decoder). The pillar column line decoder (e.g., first pillar decoding circuitry) and the pillar row line decoder (e.g., second pillar decoding circuitry) may be used to access a pillar 805 within the pillar tile. For example, the pillar column line decoder may access or activate a pillar column line 830 associated with the pillar tile and the pillar row line decoder access or activate a pillar row line 825 associated with the pillar tile. The pillar column line 830 may activate one or more switching components coupled with the pillar column line 830, which may couple the activated pillar row line 825 to the selected or activated pillar 805. A voltage may be applied to the pillar row line 825, and via the pillar row line 825 to the pillar (e.g., because the switching component is activated).

As described herein, pillar row lines 825 and pillar column line 830 may extend across multiple word line plates 810 or 815 in the corresponding horizontal or vertical direction. Alternatively, in some cases, pillar row lines 825 or pillar column lines 830 may each extend across one word line plate 810, 815 (or alternatively one word line tile) in the corresponding horizontal or vertical direction.

A memory cell 820 may be accessed (e.g., for a read or a write operation) by activating a corresponding pillar 805 and word line plate 810 or 815. For example, a first voltage may be applied to a pillar column line 830 and a second voltage may be applied to a pillar row line 825 to activate or access a corresponding pillar 805 (e.g., at an intersection of the pillar row line 825 and the pillar column line 830). Similarly, a third voltage may be applied to a word line plate 810 or 815 (e.g., the word line plate 810 or 815 may be activated) to access a memory cell 820 coupled with the activated pillar 805. For example, the memory cell 820 may be coupled with the word line plate 810 or 815 and with the pillar 805 and may be accessed based on the respective voltages applied to the word line plate 810 or 815 and the pillar 805.

As described herein, array architecture 800 may support parallel or simultaneous access operations for two or more memory cells 820 within a same page and associated with different word line plates 810 or 815. Array architecture 800 may additionally or alternatively support parallel or partially parallel access operations for two or more memory cells 820 associated with a same word line plate 810 or 815 and associated with different pillars 805.

For example, array architecture 800 may support parallel access of memory cells 835-a, 835-b, and 835-c, among other examples. In this example, first word line plate 810 may be activated, as well as the respective pillars 805 coupled with memory cells 835-a, 835-b, and 835-c, which may result in accessing memory cells 835-a, 835-b, and 835-c. In order to activate the respective pillars 805 for memory cells 835-a, 835-b, and 835-c, pillar column line 830-a may be activated, as well as pillar row lines 825-a, 825-b, and 825-c. In some cases, array architecture 800 may restrict (e.g., preclude) activating pillars 805 on adjacent pillar row lines 825. For example, the pillar 805 coupled with memory cell 835-a may be activated (e.g., via pillar row line 825-a), but pillar row lines 825 adjacent or immediately next to pillar row line 825-a (e.g., one or more pillar row lines 825 between pillar row line 825-a and pillar row line 825-b) may be kept at an inactive or deactivation voltage to prevent activation of pillars 805 coupled with those adjacent pillar row lines 825. Restricting such activations may prevent concurrent access attempts on memory cells 820 on a same word line finger, which may result in a lack of current or voltage to complete the access operation. As such, parallel programming may take place on every other pillar row line 825 (e.g., on even numbered pillar row lines 825 or on odd numbered pillar row lines 825), which may restrict parallel programming at a page level. For example, a page that includes two word line plates 810 or 815 may be further subdivided into a page of memory cells 820 (e.g., and pillars 805) associated with even numbered pillar row lines 825 (e.g., even pillar rows) and a page of memory cells 820 (e.g., and pillars 805) associated with odd numbered pillar row lines 825 (e.g., odd pillar rows).

Thus, array architecture 800 may support at least four types of logical pages, including a first type that includes memory cells within one or more even pages (e.g., pages 610) and coupled with pillars in even pillar rows, a second type that includes memory cells within one or more even pages and coupled with pillars in odd pillar rows, a third type that includes memory cells within one or more odd pages (e.g., pages 615) and coupled with pillars in even pillar rows, and a fourth type that includes memory cells within one or more odd pages and coupled with pillars in odd pillar rows. Such pages may represent a largest unit of memory cells 820 available for parallel programming using the array architecture 800. In some cases, the size of these units of pages for a parallel read or write may equal approximately 128 thousand bits (e.g., based on a size of the word line plates 810 or 815 and a quantity of associated pillar rows).

The array architecture 800 may support other operations for parallel or partially parallel access that may not involve every other pillar row line 825 (e.g., even or odd pillar row lines 825). For example, array architecture 800 may perform any parallel access that avoids simultaneous activation of adjacent pillar row lines 825 that face a same finger of an active word line plate 810 or 815. Such operations may include activating pillars 805 associated with same pillar column lines 830, for example, to avoid selection of additional memory cells 820. In some cases, different respective pillar column lines 830 may be sequentially activated while a single word line plate 810 or 815 is activated (e.g., while the word line plate 810 or 815 remains biased and loaded), to perform sequential access operations (e.g., partially parallel access operations) on multiple memory cells 820 coupled with the word line plate 810 or 815. In some cases, the same set of one or more pillar row lines 825 may remain activated while the word line plate 810 or 815 remains activated and different pillar column lines 830 are sequentially activated, such that the set of memory cells accessed in partially parallel fashion may all be within a set of one or more non-adjacent rows. In other cases, while the word line plate 810 or 815 remains activated and different pillar column lines 830 are sequentially activated, different sets of one or more pillar row lines 825 may be activated concurrent with the different pillar column lines 830 being activated, so that the one or more rows in which memory cells are accessed in partially parallel fashion may vary as different pillar column line 830 are activated (e.g., a first set of one or more non-adjacent pillar row lines 825-*a*, 825-*b*, 825-*c* may be activated when a first pillar column line 830 is activated, and second set of one or more different non-adjacent pillar row lines 825 may be activated when a second pillar column line 830 is activated, such that memory cells coupled with adjacent pillar row lines 825 may be accessed in partially parallel fashion).

Figure 9:
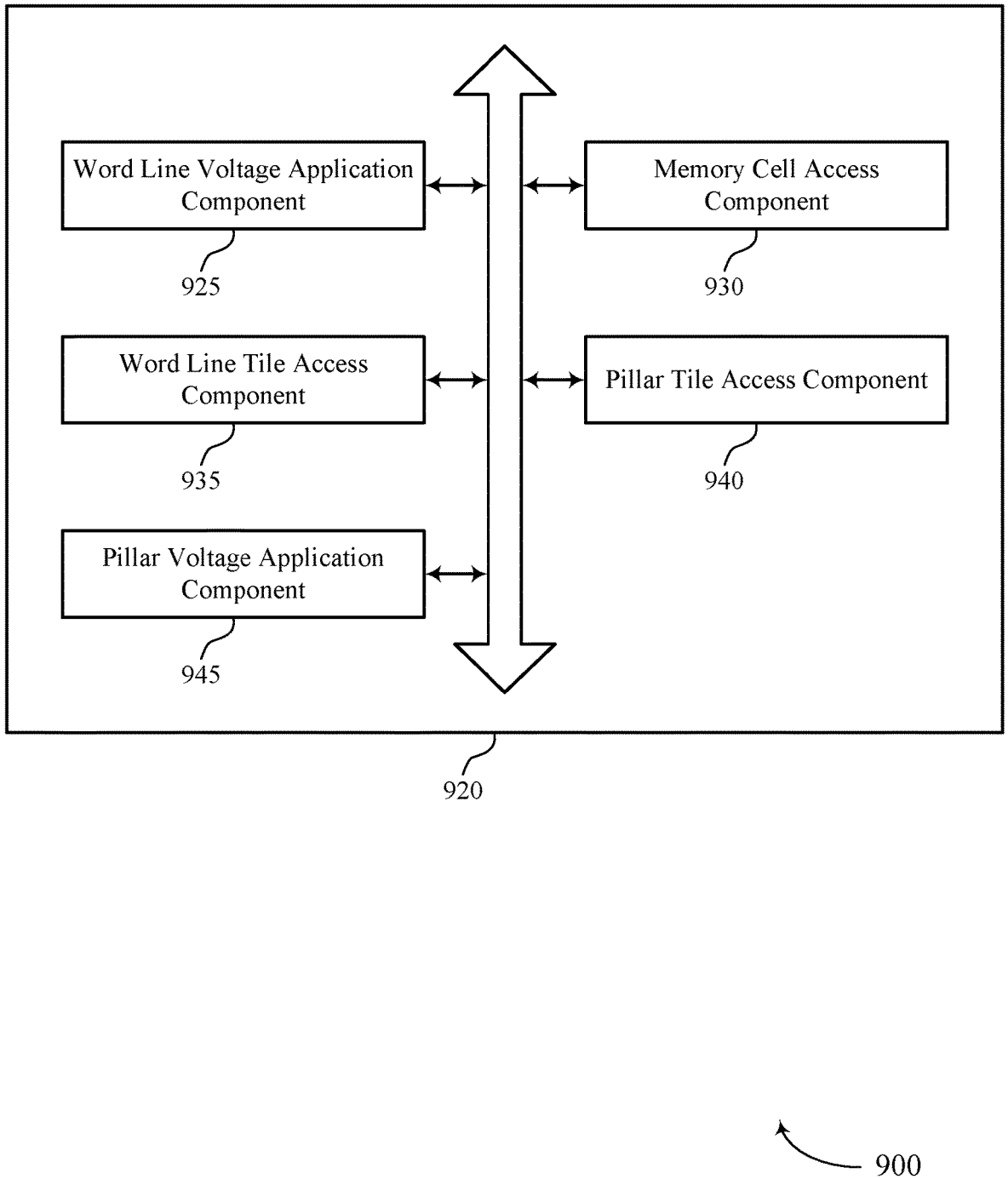
FIG. 9 shows a block diagram of a memory device that supports a decoding architecture for memory devices in accordance with examples as disclosed herein.

FIG. 9 shows a block diagram 900 of a memory device 920 that supports decoding architecture for memory devices in accordance with examples as disclosed herein. The memory device 920 may be an example of aspects of a memory device as described with reference to FIGS. 1 through 8. The memory device 920, or various components thereof, may be an example of means for performing various aspects of decoding architecture for memory devices as described herein. For example, the memory device 920 may include a word line voltage application component 925, a memory cell access component 930, a word line tile access component 935, a pillar tile access component 940, a pillar voltage application component 945, or any combination thereof. Each of these components may communicate, directly or indirectly, with one another (e.g., via one or more buses).

The word line voltage application component 925 may be configured as or otherwise support a means for applying a first voltage to an electrode coupled with a first word line plate and a second word line plate, the first word line plate including multiple first word lines each coupled with one or more respective memory cells of a set of first memory cells, and the second word line plate including multiple second word lines each coupled with one or more respective memory cells of a set of second memory cells. The memory cell access component 930 may be configured as or otherwise support a means for accessing a first memory cell of the set of first memory cells based on applying the first voltage to the first word line plate via the electrode. In some examples, the memory cell access component 930 may be configured as or otherwise support a means for accessing a second memory cell of the set of second memory cells based on applying the first voltage to the second word line plate via the electrode.

In some examples, the word line voltage application component 925 may be configured as or otherwise support a means for applying a second voltage to a second electrode coupled with a third word line plate located below the first word line plate that includes multiple third word lines each coupled with one or more respective memory cells of a set of third memory cells, where the third word line plate is electrically isolated from the first word line plate. In some examples, the memory cell access component 930 may be configured as or otherwise support a means for accessing a third memory cell of the set of third memory cells based on applying the second voltage to the third word line plate via the second electrode.

In some examples, the word line voltage application component 925 may be configured as or otherwise support a means for applying a third voltage to a third electrode coupled with a fourth word line plate located in a same plane as the first word line plate and including multiple fourth word lines each coupled with one or more respective memory cells of a set of fourth memory cells, where the fourth word line plate is electrically isolated from the first word line plate. In some examples, the memory cell access component 930 may be configured as or otherwise support a means for accessing a fourth memory cell of the set of fourth memory cells based on applying the third voltage to the fourth word line plate via the electrode. In some examples, a logical page for accessing the set of first memory cells and the set of second memory cells includes memory cells coupled with the first word line plate and the second word line plate.

In some examples, the pillar voltage application component 945 may be configured as or otherwise support a means for applying a fifth voltage to a first pillar extending through a stack of materials including the first word line plate and the second word line plate, the first pillar coupled with the first memory cell of the set of first memory cells, where accessing the first memory cell of the set of first memory cells is based on applying the fifth voltage to the first pillar. In some examples, the pillar voltage application component 945 may be configured as or otherwise support a means for applying a sixth voltage to a second pillar extending through the stack of materials, the second pillar coupled with the second memory cell of the set of second memory cells, where accessing the second memory cell of the set of second memory cells is based on applying the sixth voltage to the second pillar.

In some examples, the first pillar and the second pillar are included in different rows of pillars interposed by at least one other row of pillars, the rows of pillars associated with both the first word line plate and the second word line plate. In some examples, a capacitance of the first word line plate is based on a quantity of first word lines of the first word line plate and a length of each of the multiple first word lines, and where a capacitance of the second word line plate is based on a quantity of second word lines of the second word line plate and a length of each of the multiple second word lines.

The word line tile access component 935 may be configured as or otherwise support a means for applying, using first decoding circuitry, a first voltage to a first word line plate including multiple first word lines of a first word line tile, each word line of the multiple first word lines coupled with one or more respective memory cells of a set of first memory cells. In some examples, the word line tile access component 935 may be configured as or otherwise support a means for applying, using second decoding circuitry, a second voltage to a second word line plate including multiple second word lines of a second word line tile that is independently addressable from the first word line tile, each word line of the multiple second word lines coupled with one or more respective memory cells of a set of second memory cells. The pillar tile access component 940 may be configured as or otherwise support a means for applying, using third decoding circuitry, a third voltage to a first pillar of a pillar tile, the first pillar coupled with a first memory cell of the set of first memory cells, where the first memory cell is operable to be accessed based on applying the first voltage to the first word line plate and applying the third voltage to the first pillar. In some examples, the pillar tile access component 940 may be configured as or otherwise support a means for applying, using the third decoding circuitry, a fourth voltage to a second pillar of the pillar tile, the second pillar coupled with a second memory cell of the set of second memory cells, where the second memory cell is operable to be accessed based on applying the second voltage to the second word line plate and applying the fourth voltage to the second pillar.

In some examples, the word line tile access component 935 may be configured as or otherwise support a means for applying the first voltage to the first word line plate via an electrode coupled with the first word line plate and a third word line plate including multiple third word lines each coupled with one or more respective memory cells of a set of third memory cells, the electrode operable to concurrently activate a first word line of the multiple first word lines and a third word line of the multiple third word lines. In some examples, a logical page for accessing the set of first memory cells and the set of third memory cells includes memory cells coupled with the first word line plate and the third word line plate.

In some examples, the word line tile access component 935 may be configured as or otherwise support a means for applying, using the first decoding circuitry, a fifth voltage to a fourth word line plate located below the first word line plate and including multiple fourth word lines of a third word line tile that is independently addressable from the first word line tile, each word line of the multiple fourth word lines coupled with one or more respective memory cells of a set of fourth memory cells. In some examples, the first word line plate is electrically isolated from the second word line plate via a dielectric material positioned in a serpentine shape between the multiple first word lines and the multiple second word lines.

In some examples, the pillar tile access component 940 may be configured as or otherwise support a means for applying a sixth voltage to a first pillar column line to activate a first switching component coupled with the first pillar. In some examples, the pillar tile access component 940 may be configured as or otherwise support a means for applying the sixth voltage to a second pillar column line to activate a second switching component coupled with the second pillar. In some examples, the pillar tile access component 940 may be configured as or otherwise support a means for applying the third voltage to a first pillar row line coupled with the first switching component, where applying the third voltage to the first pillar is based on applying the third voltage to the first pillar row line. In some examples, the pillar tile access component 940 may be configured as or otherwise support a means for applying the fourth voltage to a second pillar row line coupled with the second switching component, where applying the fourth voltage to the second pillar is based on applying the fourth voltage to the second pillar row line.

In some examples, the first pillar row line and the second pillar row line include a pair of pillar row lines interposed by at least one other pillar row line. In some examples, a capacitance of the pillar tile is based on a quantity of pillars of the pillar tile and a length of each pillar of the pillar tile.

Figure 10:
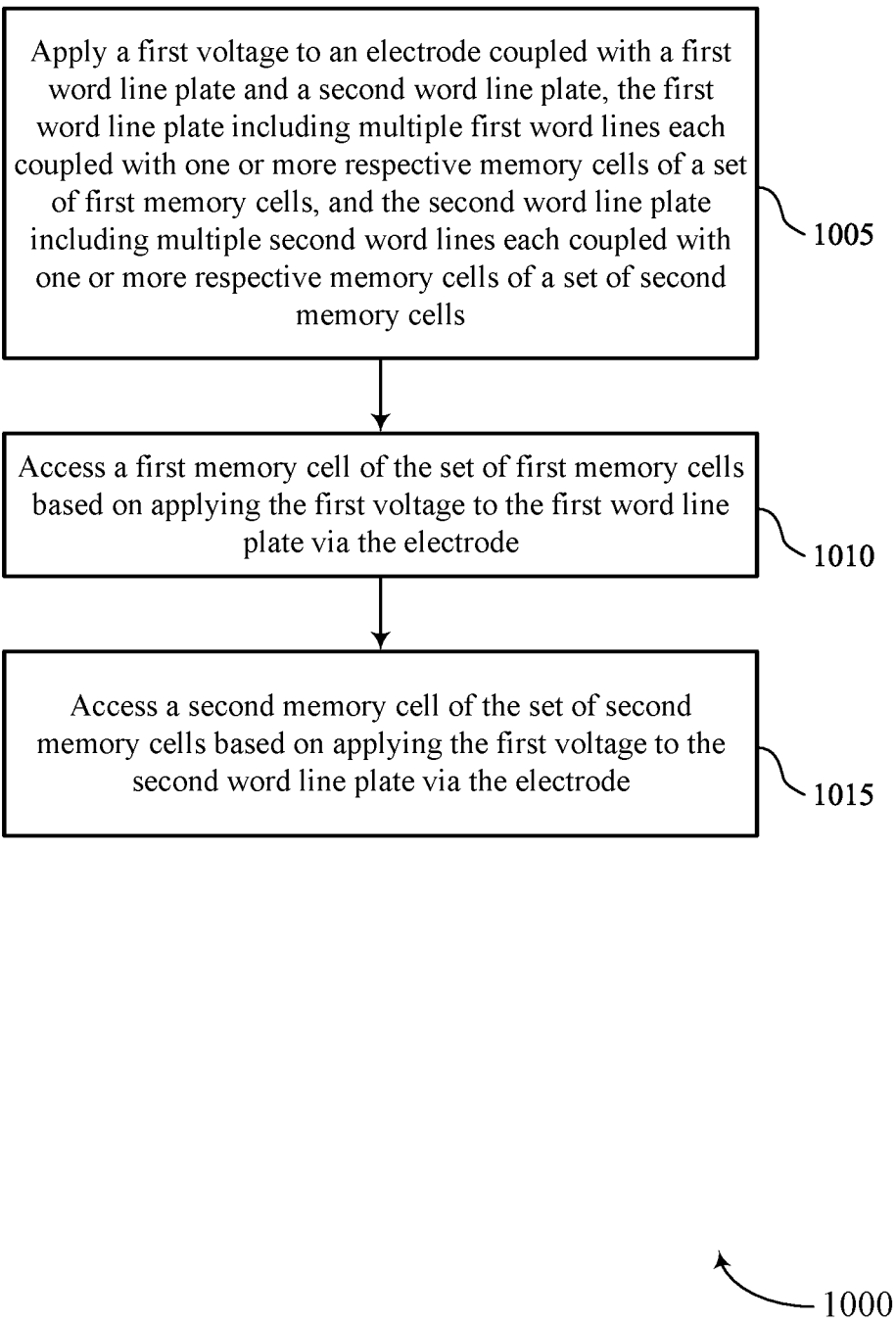
FIGS. 10 and 11 show flowcharts illustrating a method or methods that support a decoding architecture for memory devices in accordance with examples as disclosed herein.

FIG. 10 shows a flowchart illustrating a method 1000 that supports decoding architecture for memory devices in accordance with examples as disclosed herein. The operations of method 1000 may be implemented by a memory device or its components as described herein. For example, the operations of method 1000 may be performed by a memory device as described with reference to FIGS. 1 through 9. In some examples, a memory device may execute a set of instructions to control the functional elements of the device to perform the described functions. Additionally or alternatively, the memory device may perform aspects of the described functions using special-purpose hardware.

At 1005, the method may include applying a first voltage to an electrode coupled with a first word line plate and a second word line plate, the first word line plate including multiple first word lines each coupled with one or more respective memory cells of a set of first memory cells, and the second word line plate including multiple second word lines each coupled with one or more respective memory cells of a set of second memory cells. The operations of 1005 may be performed in accordance with examples as disclosed herein. In some examples, aspects of the operations of 1005 may be performed by a word line voltage application component 925 as described with reference to FIG. 9.

At 1010, the method may include accessing a first memory cell of the set of first memory cells based on applying the first voltage to the first word line plate via the electrode. The operations of 1010 may be performed in accordance with examples as disclosed herein. In some examples, aspects of the operations of 1010 may be performed by a memory cell access component 930 as described with reference to FIG. 9.

At 1015, the method may include accessing (e.g., concurrently) a second memory cell of the set of second memory cells based on applying the first voltage to the second word line plate via the electrode. The operations of 1015 may be performed in accordance with examples as disclosed herein. In some examples, aspects of the operations of 1015 may be performed by a memory cell access component 930 as described with reference to FIG. 9.

In some examples, an apparatus as described herein may perform a method or methods, such as the method 1000. The apparatus may include, features, circuitry, logic, means, or instructions (e.g., a non-transitory computer-readable medium storing instructions executable by a processor) for applying a first voltage to an electrode coupled with a first word line plate and a second word line plate, the first word line plate including multiple first word lines each coupled with one or more respective memory cells of a set of first memory cells, and the second word line plate including multiple second word lines each coupled with one or more respective memory cells of a set of second memory cells, accessing a first memory cell of the set of first memory cells based on applying the first voltage to the first word line plate via the electrode, and accessing a second memory cell of the set of second memory cells based on applying the first voltage to the second word line plate via the electrode.

Some examples of the method 1000 and the apparatus described herein may further include operations, features, circuitry, logic, means, or instructions for applying a second voltage to a second electrode coupled with a third word line plate located below the first word line plate that includes multiple third word lines each coupled with one or more respective memory cells of a set of third memory cells, where the third word line plate may be electrically isolated from the first word line plate, and accessing a third memory cell of the set of third memory cells based on applying the second voltage to the third word line plate via the second electrode.

Some examples of the method 1000 and the apparatus described herein may further include operations, features, circuitry, logic, means, or instructions for applying a third voltage to a third electrode coupled with a fourth word line plate located in a same plane as the first word line plate and including multiple fourth word lines each coupled with one or more respective memory cells of a set of fourth memory cells, where the fourth word line plate may be electrically isolated from the first word line plate, and accessing a fourth memory cell of the set of fourth memory cells based on applying the third voltage to the fourth word line plate via the electrode.

In some examples of the method 1000 and the apparatus described herein, a logical page for accessing the set of first memory cells and the set of second memory cells may include memory cells coupled with the first word line plate and the second word line plate.

Some examples of the method 1000 and the apparatus described herein may further include operations, features, circuitry, logic, means, or instructions for applying a fifth voltage to a first pillar extending through a stack of materials including the first word line plate and the second word line plate, the first pillar coupled with the first memory cell of the set of first memory cells, where accessing the first memory cell of the set of first memory cells may be based on applying the fifth voltage to the first pillar, and applying a sixth voltage to a second pillar extending through the stack of materials, the second pillar coupled with the second memory cell of the set of second memory cells, where accessing the second memory cell of the set of second memory cells may be based on applying the sixth voltage to the second pillar.

In some examples of the method 1000 and the apparatus described herein, the first pillar and the second pillar may be included in different rows of pillars interposed by at least one other row of pillars, the rows of pillars associated with both the first word line plate and the second word line plate.

In some examples of the method 1000 and the apparatus described herein, a capacitance of the first word line plate may be based on a quantity of first word lines of the first word line plate and a length of each of the multiple first word lines, and a capacitance of the second word line plate may be based on a quantity of second word lines of the second word line plate and a length of each of the multiple second word lines.

Figure 11:
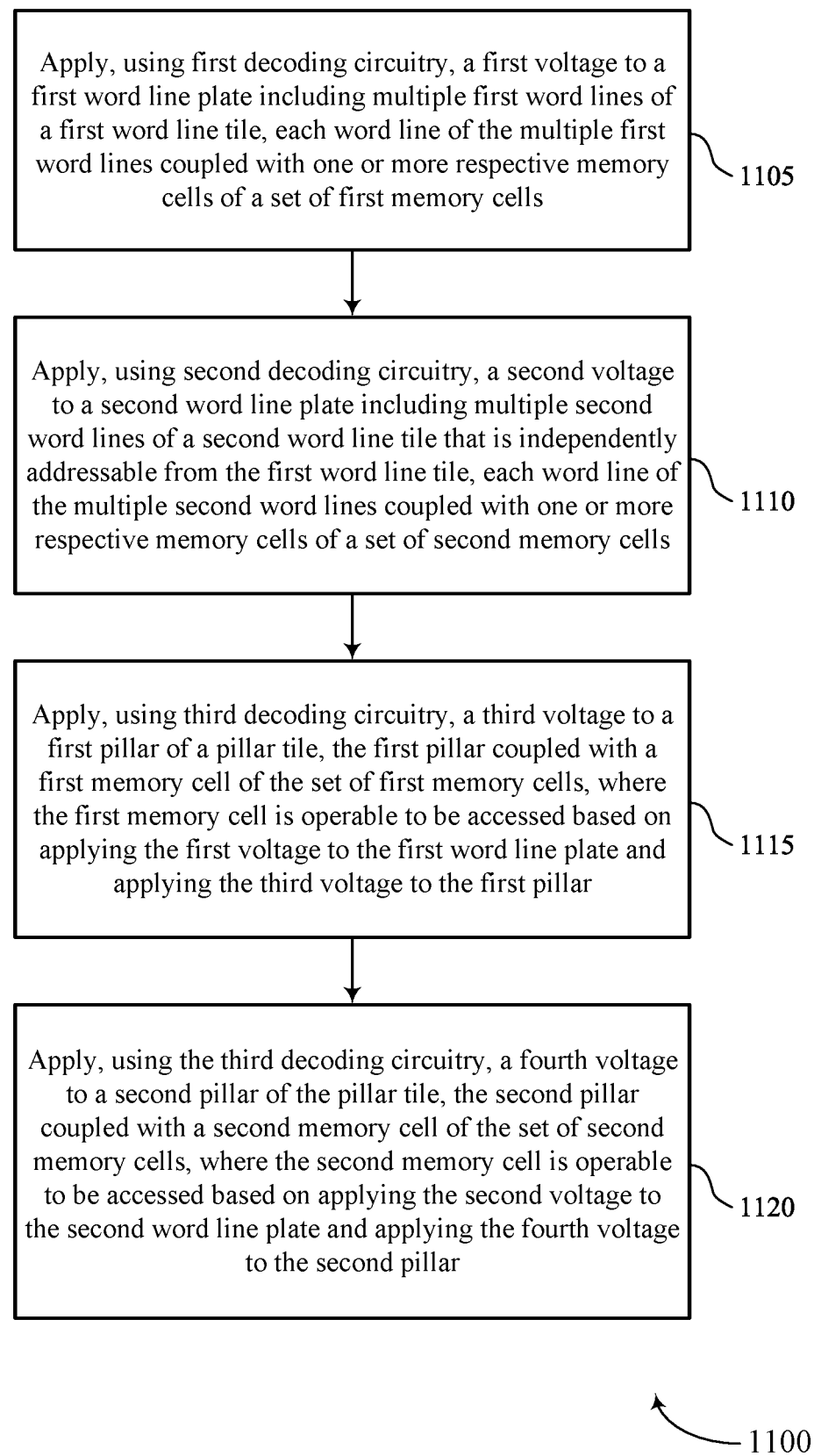

FIG. 11 shows a flowchart illustrating a method 1100 that supports decoding architecture for memory devices in accordance with examples as disclosed herein. The operations of method 1100 may be implemented by a memory device or its components as described herein. For example, the operations of method 1100 may be performed by a memory device as described with reference to FIGS. 1 through 9. In some examples, a memory device may execute a set of instructions to control the functional elements of the device to perform the described functions. Additionally or alternatively, the memory device may perform aspects of the described functions using special-purpose hardware.

At 1105, the method may include applying, using first decoding circuitry, a first voltage to a first word line plate including multiple first word lines of a first word line tile, each word line of the multiple first word lines coupled with one or more respective memory cells of a set of first memory cells. The operations of 1105 may be performed in accordance with examples as disclosed herein. In some examples, aspects of the operations of 1105 may be performed by a word line tile access component 935 as described with reference to FIG. 9.

At 1110, the method may include applying, using second decoding circuitry, a second voltage to a second word line plate including multiple second word lines of a second word line tile that is independently addressable from the first word line tile, each word line of the multiple second word lines coupled with one or more respective memory cells of a set of second memory cells. The operations of 1110 may be performed in accordance with examples as disclosed herein. In some examples, aspects of the operations of 1110 may be performed by a word line tile access component 935 as described with reference to FIG. 9.

At 1115, the method may include applying, using third decoding circuitry, a third voltage to a first pillar of a pillar tile, the first pillar coupled with a first memory cell of the set of first memory cells, where the first memory cell is operable to be accessed based on applying the first voltage to the first word line plate and applying the third voltage to the first pillar. The operations of 1115 may be performed in accordance with examples as disclosed herein. In some examples, aspects of the operations of 1115 may be performed by a pillar tile access component 940 as described with reference to FIG. 9.

At 1120, the method may include applying, using the third decoding circuitry, a fourth voltage to a second pillar of the pillar tile, the second pillar coupled with a second memory cell of the set of second memory cells, where the second memory cell is operable to be accessed based on applying the second voltage to the second word line plate and applying the fourth voltage to the second pillar. The operations of 1120 may be performed in accordance with examples as disclosed herein. In some examples, aspects of the operations of 1120 may be performed by a pillar tile access component 940 as described with reference to FIG. 9.

In some examples, an apparatus as described herein may perform a method or methods, such as the method 1100. The apparatus may include, features, circuitry, logic, means, or instructions (e.g., a non-transitory computer-readable medium storing instructions executable by a processor) for applying, using first decoding circuitry, a first voltage to a first word line plate including multiple first word lines of a first word line tile, each word line of the multiple first word lines coupled with one or more respective memory cells of a set of first memory cells, applying, using second decoding circuitry, a second voltage to a second word line plate including multiple second word lines of a second word line tile that is independently addressable from the first word line tile, each word line of the multiple second word lines coupled with one or more respective memory cells of a set of second memory cells, applying, using third decoding circuitry, a third voltage to a first pillar of a pillar tile, the first pillar coupled with a first memory cell of the set of first memory cells, where the first memory cell is operable to be accessed based on applying the first voltage to the first word line plate and applying the third voltage to the first pillar, and applying, using the third decoding circuitry, a fourth voltage to a second pillar of the pillar tile, the second pillar coupled with a second memory cell of the set of second memory cells, where the second memory cell is operable to be accessed based on applying the second voltage to the second word line plate and applying the fourth voltage to the second pillar.

Some examples of the method 1100 and the apparatus described herein may further include operations, features, circuitry, logic, means, or instructions for applying the first voltage to the first word line plate via an electrode coupled with the first word line plate and a third word line plate including multiple third word lines each coupled with one or more respective memory cells of a set of third memory cells, the electrode operable to concurrently activate a first word line of the multiple first word lines and a third word line of the multiple third word lines.

In some examples of the method 1100 and the apparatus described herein, a logical page for accessing the set of first memory cells and the set of third memory cells may include memory cells coupled with the first word line plate and the third word line plate.

Some examples of the method 1100 and the apparatus described herein may further include operations, features, circuitry, logic, means, or instructions for applying, using the first decoding circuitry, a fifth voltage to a fourth word line plate located below the first word line plate and including multiple fourth word lines of a third word line tile that may be independently addressable from the first word line tile, each word line of the multiple fourth word lines coupled with one or more respective memory cells of a set of fourth memory cells.

In some examples of the method 1100 and the apparatus described herein, the first word line plate may be electrically isolated from the second word line plate via a dielectric material positioned in a serpentine shape between the multiple first word lines and the multiple second word lines.

Some examples of the method 1100 and the apparatus described herein may further include operations, features, circuitry, logic, means, or instructions for applying a sixth voltage to a first pillar column line to activate a first switching component coupled with the first pillar, applying the sixth voltage to a second pillar column line to activate a second switching component coupled with the second pillar, applying the third voltage to a first pillar row line coupled with the first switching component, where applying the third voltage to the first pillar may be based on applying the third voltage to the first pillar row line, and applying the fourth voltage to a second pillar row line coupled with the second switching component, where applying the fourth voltage to the second pillar may be based on applying the fourth voltage to the second pillar row line.

In some examples of the method 1100 and the apparatus described herein, the first pillar row line and the second pillar row line include a pair of pillar row lines interposed by at least one other pillar row line.

In some examples of the method 1100 and the apparatus described herein, a capacitance of the pillar tile may be based on a quantity of pillars of the pillar tile and a length of each pillar of the pillar tile.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a first word line plate including multiple first word lines, each word line of the multiple first word lines coupled with one or more respective memory cells of a set of first memory cells, a second word line plate including multiple second word lines, each word line of the multiple second word lines coupled with one or more respective memory cells of a set of second memory cells, and an electrode coupled with the first word line plate and the second word line plate, the electrode operable to concurrently activate a first word line of the multiple first word lines and a second word line of the multiple second word lines to access a first memory cell of the set of first memory cells and a second memory cell of the set of second memory cells Some examples of the apparatus may further include a third word line plate located below the first word line plate and including multiple third word lines, a second electrode coupled with the third word line plate and operable to activate a third word line of the multiple third word lines, and a dielectric material interposed between the first word line plate and the third word line plate, the dielectric material electrically isolating the first word line plate from the third word line plate.

Some examples of the apparatus may further include a fourth word line plate including multiple fourth word lines and located in a same plane as the first word line plate, each word line of the multiple fourth word lines coupled with one or more respective memory cells of a set of fourth memory cells, a dielectric material positioned between the multiple first word lines and the multiple fourth word lines, where a first portion of the dielectric material extends in a first direction within the same plane, and where a second portion of the dielectric material extends in a second direction within the same plane, and a third electrode coupled with the fourth word line plate and independently operable from the electrode to activate a fourth word line of the multiple fourth word lines to access a fourth memory cell of the set of fourth memory cells.

In some examples of the apparatus, a logical page for accessing the set of first memory cells and the set of second memory cells may include memory cells coupled with the first word line plate and the second word line plate.

Some examples of the apparatus may further include multiple first pillars extending through a stack of materials including the first word line plate and the second word line plate, each first pillar of the multiple first pillars coupled with a respective memory cell of the set of first memory cells, and multiple second pillars extending through the stack of materials, each second pillar of the multiple second pillars coupled with a respective memory cell of the set of second memory cells, where each memory cell of the set of first memory cells and the set of second memory cells includes a chalcogenide material located between (e.g., in a recess between) at least one word line plate and at least one pillar.

Some examples of the apparatus may further include multiple first rows of pillars each including two or more first pillars and two or more second pillars, and multiple second rows of pillars each including two or more first pillars and two or more second pillars, each second row of pillars interposed between a corresponding set of two first rows of pillars, where the multiple first rows of pillars includes a first logical page and the multiple second rows of pillars includes a second logical page, the first logical page for accessing a first subset of the set of first memory cells and a first subset of the set of second memory cells, and the second logical page for accessing a second subset of the set of first memory cells and a second subset of the set of second memory cells.

In some examples of the apparatus, the first memory cell may be operable to be accessed based on activating a first pillar of the multiple first pillars and the first word line of the multiple first word lines, and the second memory cell of the set of second memory cells may be operable to be accessed based on activating a second pillar of the multiple second pillars and the second word line of the multiple second word lines.

In some examples of the apparatus, a capacitance of the first word line plate may be based on a quantity of first word lines of the first word line plate and a length of each of the multiple first word lines, and a capacitance of the second word line plate may be based on a quantity of second word lines of the second word line plate and a length of each of the multiple second word lines.

In some examples of the apparatus, the first word line plate may include a first sheet of conductive material that includes a first portion extending in a first direction within a plane and multiple first fingers each extending in a second direction within the plane, each of the first fingers corresponding to a respective word line of the multiple first word lines, and the second word line plate may include a second sheet of conductive material that includes a second portion extending in the first direction within the plane and multiple second fingers each extending in the second direction within the plane, each of the second fingers corresponding to a respective word line of the multiple second word lines.

Another apparatus is described. The apparatus may include a first word line tile including a first word line plate that includes multiple first word lines, each word line of the multiple first word lines coupled with one or more respective memory cells of a set of first memory cells, a second word line tile independently addressable from the first word line tile and including a second word line plate that includes multiple second word lines, each word line of the multiple second word lines coupled with one or more respective memory cells of a set of second memory cells, and a pillar tile associated with the first word line tile and the second word line tile, the pillar tile including a group of pillars that includes multiple first pillars, each pillar of the multiple first pillars coupled with a respective memory cell of the set of first memory cells, and multiple second pillars, each pillar of the multiple second pillars coupled with a respective memory cell of the set of second memory cells Some examples of the apparatus may further include a third word line plate that includes multiple third word lines, each word line of the multiple third word lines coupled with one or more respective memory cells of a set of third memory cells and an electrode coupled with the first word line plate and the third word line plate, the electrode operable to concurrently activate a first word line of the multiple first word lines and a third word line of the multiple third word lines.

In some examples of the apparatus, a logical page for accessing the set of first memory cells and the set of third memory cells may include memory cells coupled with the first word line plate and the third word line plate.

Some examples of the apparatus may further include multiple first rows of pillars each including two or more first pillars and two or more second pillars, and multiple second rows of pillars each including two or more first pillars and two or more second pillars, each second row of pillars interposed between a corresponding set of two first rows of pillars, where the multiple first rows of pillars includes a first logical page and the multiple second rows of pillars includes a second logical page, the first logical page for accessing a first subset of the set of first memory cells and a first subset of the set of third memory cells, and the second logical page for accessing a second subset of the set of first memory cells and a second subset of the set of third memory cells.

Some examples of the apparatus may further include a third word line tile independently addressable from the first word line tile and including a fourth word line plate that may be located below the first word line plate and that includes multiple fourth word lines, dielectric material interposed between the first word line plate and the fourth word line plate, the dielectric material electrically isolating the first word line plate from the fourth word line plate, and first decoding circuitry coupled with the first word line plate via a first electrode and coupled with the fourth word line plate via a second electrode, the first decoding circuitry operable to activate a first word line of the multiple first word lines or a fourth word line of the multiple fourth word lines.

Some examples of the apparatus may further include a dielectric material positioned between the multiple first word lines and the multiple second word lines, the dielectric material electrically isolating the first word line plate from the second word line plate, where a first portion of the dielectric material extends in a first direction within a same plane as the first word line plate and the second word line plate, and where a second portion of the dielectric material extends in a second direction within the same plane.

Some examples of the apparatus may further include first decoding circuitry associated with the first word line tile and operable to activate one or more word lines of the multiple first word lines, second decoding circuitry associated with the second word line tile and operable to activate one or more word lines of the multiple second word lines, and third decoding circuitry associated with the pillar tile and operable to activate one or more pillars of the group of pillars.

In some examples of the apparatus, the third decoding circuitry may include multiple pillar column lines each associated with a respective column of the group of pillars, multiple pillar row lines each associated with a respective row of the group of pillars, multiple switching components each coupled with a respective pillar of the group of pillars, a respective pillar column line of the multiple pillar column lines, and a respective pillar row line of the multiple pillar row lines, a first decoder operable to activate a pillar column line to activate one or more switching components of the multiple switching components, and a second decoder operable to activate a pillar row line coupled with a switching component of the one or more switching components, where activating the pillar column line and the pillar row line activates a pillar of the group of pillars that may be associated with the pillar column line, the pillar row line, and the switching component.

In some examples of the apparatus, a capacitance of the pillar tile may be based on a quantity of pillars of the group of pillars and a length of each pillar of the group of pillars.

In some examples of the apparatus, each memory cell of the set of first memory cells and the set of second memory cells may include a chalcogenide material located between (e.g., in a recess between) at least one word line plate and at least one pillar.

Another apparatus is described. The apparatus may include a first word line plate including multiple first word lines, a second word line plate including multiple second word lines, an electrode coupled with the first word line plate and the second word line plate, and a controller. The controller may operable to cause the apparatus to apply a first voltage to the electrode, access, based on applying the first voltage to the first word line plate via the electrode, a first memory cell coupled with a first word line of the multiple first word lines, and access (e.g., concurrently), based on applying the first voltage to the second word line plate via the electrode, a second memory cell coupled with a second word line of the multiple second word lines.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first word line plate comprising a plurality of first word lines, each word line of the plurality of first word lines coupled with one or more respective memory cells of a plurality of first memory cells;
a second word line plate comprising a plurality of second word lines, each word line of the plurality of second word lines coupled with one or more respective memory cells of a plurality of second memory cells; and
an electrode coupled with the first word line plate and the second word line plate, the electrode operable to concurrently activate a first word line of the plurality of first word lines and a second word line of the plurality of second word lines to access a first memory cell of the plurality of first memory cells and a second memory cell of the plurality of second memory cells.

2. The apparatus of claim 1, further comprising:
a third word line plate located below the first word line plate and comprising a plurality of third word lines;
a second electrode coupled with the third word line plate and operable to activate a third word line of the plurality of third word lines; and
a dielectric material interposed between the first word line plate and the third word line plate, the dielectric material electrically isolating the first word line plate from the third word line plate.

3. The apparatus of claim 1, further comprising:
a fourth word line plate comprising a plurality of fourth word lines and located in a same plane as the first word line plate, each word line of the plurality of fourth word lines coupled with one or more respective memory cells of a plurality of fourth memory cells;
a dielectric material positioned between the plurality of first word lines and the plurality of fourth word lines, wherein a first portion of the dielectric material extends in a first direction within the same plane, and wherein a second portion of the dielectric material extends in a second direction within the same plane; and
a third electrode coupled with the fourth word line plate and independently operable from the electrode to activate a fourth word line of the plurality of fourth word lines to access a fourth memory cell of the plurality of fourth memory cells.

4. The apparatus of claim 1, wherein a logical page for accessing the plurality of first memory cells and the plurality of second memory cells comprises memory cells coupled with the first word line plate and the second word line plate.

5. The apparatus of claim 1, further comprising:
a plurality of first pillars extending through a stack of materials comprising the first word line plate and the second word line plate, each first pillar of the plurality of first pillars coupled with a respective memory cell of the plurality of first memory cells; and
a plurality of second pillars extending through the stack of materials, each second pillar of the plurality of second pillars coupled with a respective memory cell of the plurality of second memory cells, wherein each memory cell of the plurality of first memory cells and the plurality of second memory cells comprises a chalcogenide material located between at least one word line plate and at least one pillar.

6. The apparatus of claim 5, further comprising:
a plurality of first rows of pillars each comprising two or more first pillars and two or more second pillars; and
a plurality of second rows of pillars each comprising two or more first pillars and two or more second pillars, each second row of pillars interposed between a corresponding set of two first rows of pillars, wherein the plurality of first rows of pillars comprises a first logical page and the plurality of second rows of pillars comprises a second logical page, the first logical page for accessing a first subset of the plurality of first memory cells and a first subset of the plurality of second memory cells, and the second logical page for accessing a second subset of the plurality of first memory cells and a second subset of the plurality of second memory cells.

7. The apparatus of claim 5, wherein:
the first memory cell is operable to be accessed based at least in part on activating a first pillar of the plurality of first pillars and the first word line of the plurality of first word lines, and
the second memory cell of the plurality of second memory cells is operable to be accessed based at least in part on activating a second pillar of the plurality of second pillars and the second word line of the plurality of second word lines.

8. The apparatus of claim 1, wherein:
a capacitance of the first word line plate is based at least in part on a quantity of first word lines of the first word line plate and a length of each of the plurality of first word lines; and
a capacitance of the second word line plate is based at least in part on a quantity of second word lines of the second word line plate and a length of each of the plurality of second word lines.

9. The apparatus of claim 1, wherein:
the first word line plate comprises a first sheet of conductive material that includes a first portion extending in a first direction within a plane and a plurality of first fingers each extending in a second direction within the plane, each of the first fingers corresponding to a respective word line of the plurality of first word lines; and
the second word line plate comprises a second sheet of conductive material that includes a second portion extending in the first direction within the plane and a plurality of second fingers each extending in the second direction within the plane, each of the second fingers corresponding to a respective word line of the plurality of second word lines.

10. A method, comprising:
applying a first voltage to an electrode coupled with a first word line plate and a second word line plate, the first word line plate comprising a plurality of first word lines each coupled with one or more respective memory cells of a plurality of first memory cells, and the second word line plate comprising a plurality of second word lines each coupled with one or more respective memory cells of a plurality of second memory cells;
accessing a first memory cell of the plurality of first memory cells based at least in part on applying the first voltage to the first word line plate via the electrode; and
accessing a second memory cell of the plurality of second memory cells based at least in part on applying the first voltage to the second word line plate via the electrode.

11. The method of claim 10, further comprising:
applying a second voltage to a second electrode coupled with a third word line plate located below the first word line plate that comprises a plurality of third word lines each coupled with one or more respective memory cells of a plurality of third memory cells, wherein the third word line plate is electrically isolated from the first word line plate; and
accessing a third memory cell of the plurality of third memory cells based at least in part on applying the second voltage to the third word line plate via the second electrode.

12. The method of claim 10, further comprising:
applying a third voltage to a third electrode coupled with a fourth word line plate located in a same plane as the first word line plate and comprising a plurality of fourth word lines each coupled with one or more respective memory cells of a plurality of fourth memory cells, wherein the fourth word line plate is electrically isolated from the first word line plate; and
accessing a fourth memory cell of the plurality of fourth memory cells based at least in part on applying the third voltage to the fourth word line plate via the electrode.

13. The method of claim 10, wherein a logical page for accessing the plurality of first memory cells and the plurality of second memory cells comprises memory cells coupled with the first word line plate and the second word line plate.

14. The method of claim 10, further comprising:
applying a fifth voltage to a first pillar extending through a stack of materials comprising the first word line plate and the second word line plate, the first pillar coupled with the first memory cell of the plurality of first memory cells, wherein accessing the first memory cell of the plurality of first memory cells is based at least in part on applying the fifth voltage to the first pillar; and
applying a sixth voltage to a second pillar extending through the stack of materials, the second pillar coupled with the second memory cell of the plurality of second memory cells, wherein accessing the second memory cell of the plurality of second memory cells is based at least in part on applying the sixth voltage to the second pillar.

15. The method of claim 14, wherein the first pillar and the second pillar are included in different rows of pillars interposed by at least one other row of pillars, the rows of pillars associated with both the first word line plate and the second word line plate.

16. The method of claim 10, wherein a capacitance of the first word line plate is based at least in part on a quantity of first word lines of the first word line plate and a length of each of the plurality of first word lines, and wherein a capacitance of the second word line plate is based at least in part on a quantity of second word lines of the second word line plate and a length of each of the plurality of second word lines.

17. An apparatus, comprising:
a first word line tile comprising a first word line plate that includes a plurality of first word lines, each word line of the plurality of first word lines coupled with one or more respective memory cells of a plurality of first memory cells;
a second word line tile independently addressable from the first word line tile and comprising a second word line plate that includes a plurality of second word lines, each word line of the plurality of second word lines coupled with one or more respective memory cells of a plurality of second memory cells; and
a pillar tile associated with the first word line tile and the second word line tile, the pillar tile comprising a group of pillars that comprises:
a plurality of first pillars, each pillar of the plurality of first pillars coupled with a respective memory cell of the plurality of first memory cells; and
a plurality of second pillars, each pillar of the plurality of second pillars coupled with a respective memory cell of the plurality of second memory cells.

18. The apparatus of claim 17, further comprising:
a third word line plate that includes a plurality of third word lines, each word line of the plurality of third word lines coupled with one or more respective memory cells of a plurality of third memory cells; and an electrode coupled with the first word line plate and the third word line plate, the electrode operable to concurrently activate a first word line of the plurality of first word lines and a third word line of the plurality of third word lines.

19. The apparatus of claim 18, wherein a logical page for accessing the plurality of first memory cells and the plurality of third memory cells comprises memory cells coupled with the first word line plate and the third word line plate.

20. The apparatus of claim 18, further comprising:
a plurality of first rows of pillars each comprising two or more first pillars and two or more second pillars; and
a plurality of second rows of pillars each comprising two or more first pillars and two or more second pillars, each second row of pillars interposed between a corresponding set of two first rows of pillars, wherein the plurality of first rows of pillars comprises a first logical page and the plurality of second rows of pillars comprises a second logical page, the first logical page for accessing a first subset of the plurality of first memory cells and a first subset of the plurality of third memory cells, and the second logical page for accessing a second subset of the plurality of first memory cells and a second subset of the plurality of third memory cells.

21. The apparatus of claim 17, further comprising:
a third word line tile independently addressable from the first word line tile and comprising a fourth word line plate that is located below the first word line plate and that includes a plurality of fourth word lines;
dielectric material interposed between the first word line plate and the fourth word line plate, the dielectric material electrically isolating the first word line plate from the fourth word line plate; and
first decoding circuitry coupled with the first word line plate via a first electrode and coupled with the fourth word line plate via a second electrode, the first decoding circuitry operable to activate a first word line of the plurality of first word lines or a fourth word line of the plurality of fourth word lines.

22. The apparatus of claim 17, further comprising:
a dielectric material positioned between the plurality of first word lines and the plurality of second word lines, the dielectric material electrically isolating the first word line plate from the second word line plate, wherein a first portion of the dielectric material extends in a first direction within a same plane as the first word line plate and the second word line plate, and wherein a second portion of the dielectric material extends in a second direction within the same plane.

23. The apparatus of claim 17, further comprising:
first decoding circuitry associated with the first word line tile and operable to activate one or more word lines of the plurality of first word lines;
second decoding circuitry associated with the second word line tile and operable to activate one or more word lines of the plurality of second word lines; and
third decoding circuitry associated with the pillar tile and operable to activate one or more pillars of the group of pillars.

24. The apparatus of claim 23, wherein the third decoding circuitry comprises:
a plurality of pillar column lines each associated with a respective column of the group of pillars;
a plurality of pillar row lines each associated with a respective row of the group of pillars;

a plurality of switching components each coupled with a respective pillar of the group of pillars, a respective pillar column line of the plurality of pillar column lines, and a respective pillar row line of the plurality of pillar row lines;
a first decoder operable to activate a pillar column line to activate one or more switching components of the plurality of switching components; and
a second decoder operable to activate a pillar row line coupled with a switching component of the one or more switching components, wherein activating the pillar column line and the pillar row line activates a pillar of the group of pillars that is associated with the pillar column line, the pillar row line, and the switching component.

25. The apparatus of claim 17, wherein a capacitance of the pillar tile is based at least in part on a quantity of pillars of the group of pillars and a length of each pillar of the group of pillars.

26. The apparatus of claim 17, wherein each memory cell of the plurality of first memory cells and the plurality of second memory cells comprises a chalcogenide material located between at least one word line plate and at least one pillar.

27. A method, comprising:
applying, using first decoding circuitry, a first voltage to a first word line plate comprising a plurality of first word lines of a first word line tile, each word line of the plurality of first word lines coupled with one or more respective memory cells of a plurality of first memory cells;
applying, using second decoding circuitry, a second voltage to a second word line plate comprising a plurality of second word lines of a second word line tile that is independently addressable from the first word line tile, each word line of the plurality of second word lines coupled with one or more respective memory cells of a plurality of second memory cells;
applying, using third decoding circuitry, a third voltage to a first pillar of a pillar tile, the first pillar coupled with a first memory cell of the plurality of first memory cells, wherein the first memory cell is operable to be accessed based at least in part on applying the first voltage to the first word line plate and applying the third voltage to the first pillar; and
applying, using the third decoding circuitry, a fourth voltage to a second pillar of the pillar tile, the second pillar coupled with a second memory cell of the plurality of second memory cells, wherein the second memory cell is operable to be accessed based at least in part on applying the second voltage to the second word line plate and applying the fourth voltage to the second pillar.

28. The method of claim 27, further comprising:
applying the first voltage to the first word line plate via an electrode coupled with the first word line plate and a third word line plate comprising a plurality of third word lines each coupled with one or more respective memory cells of a plurality of third memory cells, the electrode operable to concurrently activate a first word line of the plurality of first word lines and a third word line of the plurality of third word lines.

29. The method of claim 28, wherein a logical page for accessing the plurality of first memory cells and the plurality of third memory cells comprises memory cells coupled with the first word line plate and the third word line plate.

30. The method of claim 27, further comprising:
applying, using the first decoding circuitry, a fifth voltage to a fourth word line plate located below the first word line plate and comprising a plurality of fourth word lines of a third word line tile that is independently addressable from the first word line tile, each word line of the plurality of fourth word lines coupled with one or more respective memory cells of a plurality of fourth memory cells.

31. The method of claim 27, wherein the first word line plate is electrically isolated from the second word line plate via a dielectric material positioned in a serpentine shape between the plurality of first word lines and the plurality of second word lines.

32. The method of claim 27, further comprising:
applying a sixth voltage to a first pillar column line to activate a first switching component coupled with the first pillar;
applying the sixth voltage to a second pillar column line to activate a second switching component coupled with the second pillar;
applying the third voltage to a first pillar row line coupled with the first switching component, wherein applying the third voltage to the first pillar is based at least in part on applying the third voltage to the first pillar row line; and
applying the fourth voltage to a second pillar row line coupled with the second switching component, wherein applying the fourth voltage to the second pillar is based at least in part on applying the fourth voltage to the second pillar row line.

33. The method of claim 32, wherein the first pillar row line and the second pillar row line comprise a pair of pillar row lines interposed by at least one other pillar row line.

34. The method of claim 27, wherein a capacitance of the pillar tile is based at least in part on a quantity of pillars of the pillar tile and a length of each pillar of the pillar tile.

35. An apparatus, comprising:
a first word line plate comprising a plurality of first word lines;
a second word line plate comprising a plurality of second word lines;
an electrode coupled with the first word line plate and the second word line plate; and
a controller operable to cause the apparatus to:
apply a first voltage to the electrode;
access, based at least in part on applying the first voltage to the first word line plate via the electrode, a first memory cell coupled with a first word line of the plurality of first word lines; and
access, based at least in part on applying the first voltage to the second word line plate via the electrode, a second memory cell coupled with a second word line of the plurality of second word lines.

* * * * *